(12) United States Patent
Liang et al.

(10) Patent No.: US 11,594,609 B2
(45) Date of Patent: Feb. 28, 2023

(54) LINER-FREE CONDUCTIVE STRUCTURES

(71) Applicant: Taiwan Semiconductor Manufacturing, Co., Ltd., Hsinchu (TW)

(72) Inventors: Shuen-Shin Liang, Hsinchu (TW); Chun-I Tsai, Hsinchu (TW); Chih-Wei Chang, Hsinchu (TW); Chun-Hsien Huang, Hsinchu (TW); Hung-Yi Huang, Hsinchu (TW); Keng-Chu Lin, Chao-Chou Ping-Tung (TW); Ken-Yu Chang, Hsinchu (TW); Sung-Li Wang, Zhubei (TW); Chia-Hung Chu, Taipei (TW); Hsu-Kai Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/887,577

(22) Filed: May 29, 2020

(65) Prior Publication Data
US 2021/0376103 A1 Dec. 2, 2021

(51) Int. Cl.
*H01L 29/45* (2006.01)
*H01L 23/535* (2006.01)
*H01L 21/768* (2006.01)

(52) U.S. Cl.
CPC ........ *H01L 29/45* (2013.01); *H01L 21/76802* (2013.01); *H01L 21/76877* (2013.01); *H01L 21/76895* (2013.01); *H01L 23/535* (2013.01)

(58) Field of Classification Search
CPC .............. H01L 29/45; H01L 21/76802; H01L 21/76877; H01L 21/76895; H01L 23/535
See application file for complete search history.

(56) References Cited

U.S. PATENT DOCUMENTS

| | | | | |
|---|---|---|---|---|
| 9,589,836 | B1* | 3/2017 | Zhang | H01L 21/76877 |
| 9,741,609 | B1* | 8/2017 | Cheng | H01L 23/485 |
| 9,960,078 | B1* | 5/2018 | Clevenger | H01L 23/53266 |
| 2019/0164885 | A1* | 5/2019 | Yang | H01L 23/5283 |
| 2020/0020626 | A1* | 1/2020 | Yang | H01L 21/76808 |

* cited by examiner

*Primary Examiner* — Shahed Ahmed
*Assistant Examiner* — Vicki B. Booker
(74) *Attorney, Agent, or Firm* — Sterne, Kessler, Goldstein & Fox P.L.L.C.

(57) ABSTRACT

The present disclosure describes a method for forming liner-free or barrier-free conductive structures. The method includes forming a liner-free conductive structure on a cobalt conductive structure disposed on a substrate, depositing a cobalt layer on the liner-free conductive structure and exposing the liner-free conductive structure to a heat treatment. The method further includes removing the cobalt layer from the liner-free conductive structure.

20 Claims, 20 Drawing Sheets

LINER-FREE CONDUCTIVE STRUCTURES

BACKGROUND

In an integrated circuit, conductive structures (e.g., metal contacts, vias, and lines) are electrically coupled to transistor regions, such as the gate electrode and the source/drain terminals, and are configured to propagate electrical signals from and to the transistors. The conductive structures, depending on the complexity of the integrated circuit, can form one or more layers of metal wiring.

BRIEF DESCRIPTION OF THE DRAWINGS

Aspects of the present disclosure are best understood from the following detailed description when read with the accompanying figures.

DETAILED DESCRIPTION

Figure 1:
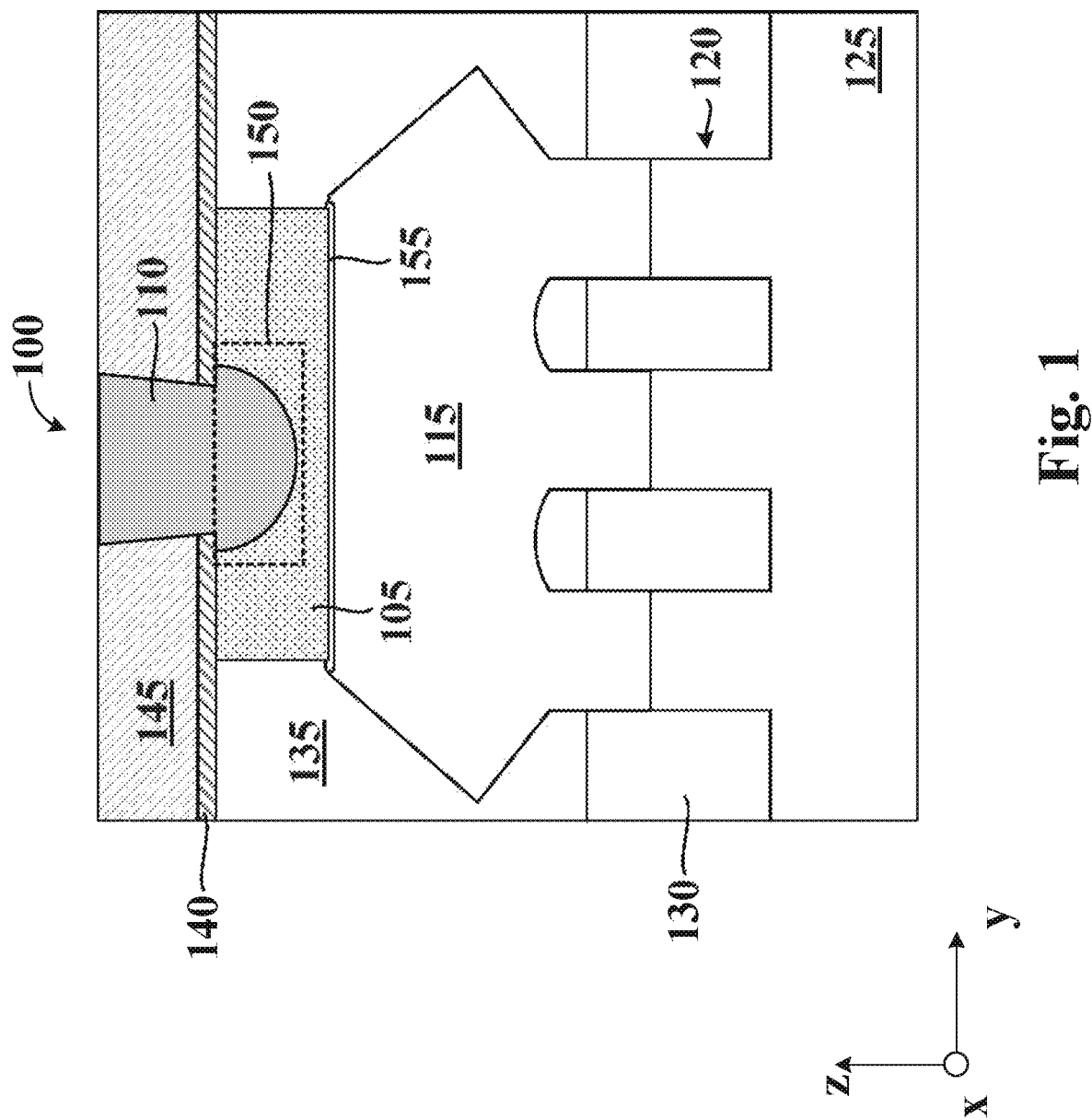
FIG. 1 is a cross-sectional view of a structure with barrier-free or liner-free conductive structures thereon, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes and/or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

Active and passive devices in an integrated circuit (IC) are interconnected at a local level (e.g., within the same area of the IC) and at a global level (e.g., between different areas of the IC) through a number of conductive structures, such as metal contacts, metal vias, and metal lines. These conductive structures—which can include different conductive materials (e.g., a different metal fill)—are formed in vertically stacked metallization layers. Design considerations are taken into account when metallization layers with different conductive materials are stacked on top of each other to avoid performance degradation due to any unwanted interaction between the conductive materials. This is especially the case for conductive structures without barrier or liner layers.

Conductive structures without barrier or liner layers (also referred to herein as "liner-free or barrier-free conductive structures") can have lower electrical resistance compared to conductive structures with barrier or liner layers. This is because liner or barrier layers—which can be more resistive than a metal fill layer—consume area within the conductive structure. Therefore, by eliminating the liner or barrier layers in the conductive structures, the lower resistance metal fill can occupy the entire volume of the conductive structure and reduce the overall contact resistance of the conductive structure.

In the absence of liner or barrier layers, liner-free or barrier-free conductive structures formed in contact with conductive structures filled with a different metal may be unable to prevent out-diffusion of the underlying metal under certain conditions. For example, ruthenium filled liner-free or barrier-free conductive structures overlying a cobalt conductive structure are unable to prevent cobalt out-diffusion through the ruthenium metal grain boundaries when both structures are annealed. Cobalt out-diffusion results in voids within cobalt conductive structure. The aforementioned behavior poses limitations to the implementation of ruthenium filled liner-free or barrier-free conductive structures and makes the ruthenium filled liner-free or barrier-free conductive structures challenging to integrate with cobalt conductive structures.

To address the aforementioned shortcomings, this disclosure describes methods directed to the suppression of cobalt out-diffusion from underlying cobalt conductive structures to overlying ruthenium-filled liner-free or barrier-free conductive structures. In some embodiments, a cobalt layer formed on the ruthenium conductive structures acts as a "reservoir" for cobalt atoms that mitigates out-diffusion of cobalt atoms from underlying cobalt conductive structures. In some embodiments, the cobalt layer is a sacrificial layer subsequently removed prior to the formation of additional wiring levels. In some embodiments, a portion of the cobalt layer is incorporated in the ruthenium-filled liner-free or barrier-free conductive structures. In some embodiments, cobalt atoms diffuse from both the overlying cobalt layer and the underlying cobalt conductive structures into the ruthenium-filled liner-free or barrier-free conductive structures to fill voids or grain boundaries within the ruthenium metal fill. In some embodiments, the ruthenium-filled liner-free or barrier-free conductive structures are recessed with an etch-back process prior to the formation of the cobalt layer. In some embodiments, the liner-free or barrier-free conductive structures are partially filled with ruthenium prior to the formation of the cobalt layer.

According to some embodiments, FIG. 1 is a cross-sectional view of a structure with liner-free or barrier-free conductive structure 100 (also referred to herein as "liner-free conductive structure 100") formed on a cobalt conductive structure 105. In some embodiments, the liner-free conductive structure 100 is filled with ruthenium metal 110. As shown in FIG. 1, cobalt conductive structure 105 is formed on a merged source/drain epitaxial structure 115 grown on fin structures 120, which are in turn disposed on a substrate 125. In some embodiments, fin structures 120 and the bottom portion of source/drain epitaxial layer 115 are surrounded by a first dielectric layer 130, while the upper portion of source/drain epitaxial layer 115 and cobalt conductive structure 105 are surrounded by a second dielectric layer 135. In some embodiments, first dielectric layer 130 forms an isolation structure, such a shallow trench isolation (STI).

The top and mid-sections of liner-free conductive structure 100 (e.g., above cobalt conductive structure 105) are surrounded by an etch stop layer 140 and an interlayer dielectric (ILD) 145. In contrast, bottom sections of liner-free conductive structure 100 (e.g., below the top surface of cobalt conductive structure 105) are embedded in cobalt conductive structure 105. The bottom sections of liner-free conductive structure 100 (e.g., within cobalt conductive structure 105) are semi-spherically shaped and each forms an "anchor point" 150 that prevents ruthenium metal 110 from being "pulled-out" during a subsequent ruthenium planarization process. Anchor point 150 also increases the surface area between ruthenium metal 110 and cobalt conductive structure 105 to reduce the contact resistance between the two structures. In some embodiments, a silicide layer 155 is interposed between cobalt conductive structure 105 and source/drain epitaxial structure 115 to reduce the electrical resistance between cobalt conductive structure 105 and source/drain epitaxial structure 115.

The structures shown in FIG. 1 are exemplary and variations are within the spirit and the scope of this disclosure. For example, each fin structure 120 can have its own source/drain epitaxial structure instead of a single merged source/drain epitaxial structure 115. Further, additional or fewer liner-free conductive structures, like liner-free conductive structure 100, can be formed on cobalt conductive structure 105 or other cobalt conductive structures not shown in FIG. 1. Additional or fewer fin structures 120 can also be formed on substrate 125. Further, FIG. 1 shows selective portions of the structures and other portions are not shown for simplicity. For example, liner layers, barrier layers, or adhesion layers for cobalt structure 105 are not shown in FIG. 1. Further, a gate structure formed on fin structures 120 adjacent to source/drain epitaxial structure 115 along the x-direction, spacer structures, doped regions, and capping layers for source/drain epitaxial structure 115 and fin structures 120 are not shown.

In some embodiments, cobalt structure 105 is a source/drain contact on which liner-free conductive structure 100 is formed without intervening layers, such as barrier layers, liner layers, or adhesion layers. In some embodiments, liner-free conductive structures, like liner-free conductive structure 100, form a network of vertical contacts that electrically connect cobalt structures, like cobalt structure 105, to upper metallization levels (e.g., to copper metallization levels) not shown in FIG. 1 for simplicity. According to some embodiments, liner-free conductive structure 100 is formed with a process that mitigates cobalt out-diffusion to the upper metallization levels through liner-free conductive structure 100. Cobalt out-diffusion creates voids in cobalt conductive structure 105 and can result in resistance degradation (e.g., a resistance increase of up to about 15%). In some cases, cobalt out-diffusion, if allowed, results in electrical opens within the cobalt conductive structure 105.

Figure 2A:
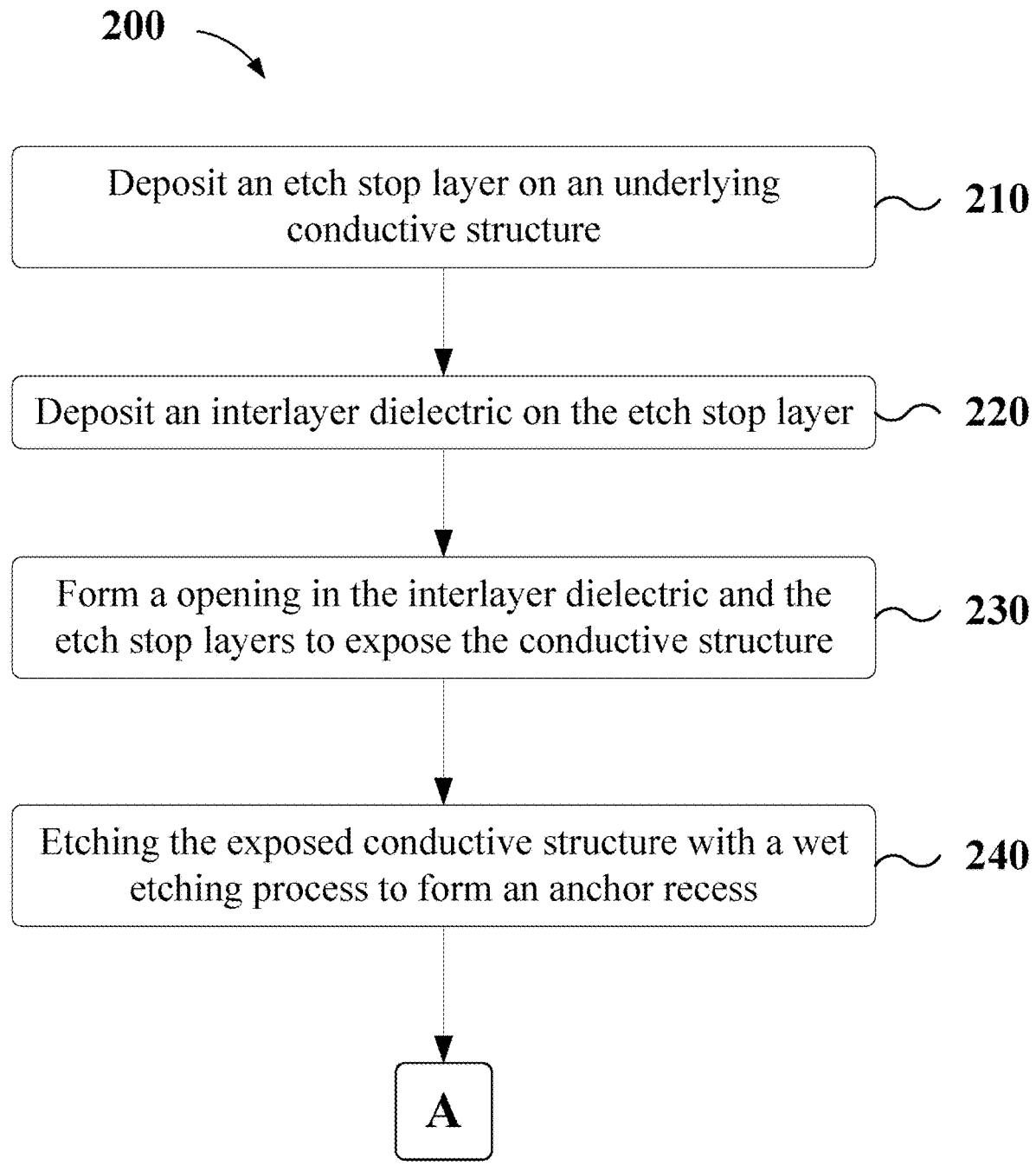
FIGS. 2A and 2B are flowcharts of a method describing the formation of barrier-free or liner-free conductive structures, in accordance with some embodiments.
Figure 2B:
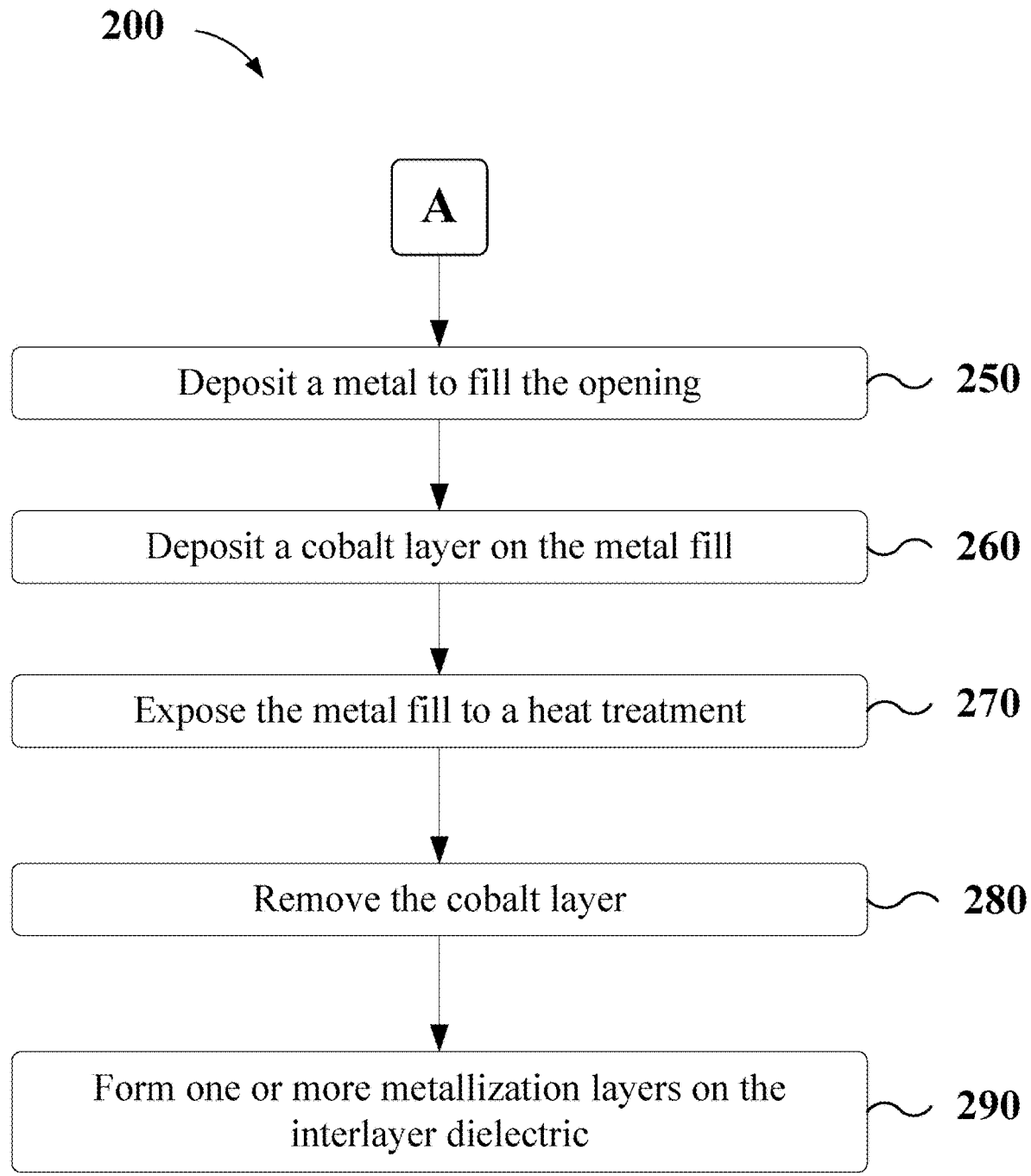

In some embodiments, FIGS. 2A and 2B are flowcharts of a fabrication method 200 for the formation of liner-free conductive structure 100 shown in FIG. 1. Other fabrication operations may be performed between the various operations of method 200 and may be omitted merely for clarity and ease of description. These various operations are within the spirit and the scope of this disclosure. Additionally, not all operations may be required to perform the disclosure provided herein. Some of the operations may be performed simultaneously, or in a different order than the ones shown in FIGS. 2A and 2B. In some embodiments, one or more other operations may be performed in addition to or in place of the presently described operations.

Liner-free conductive structure 100 fabricated with method 200 is not limited to cobalt source/drain contacts. For example, liner-free conductive structure 100 can be formed using method 200 on cobalt-containing gate contacts or any other type of cobalt conductive structure used in integrated circuits.

Figure 3:
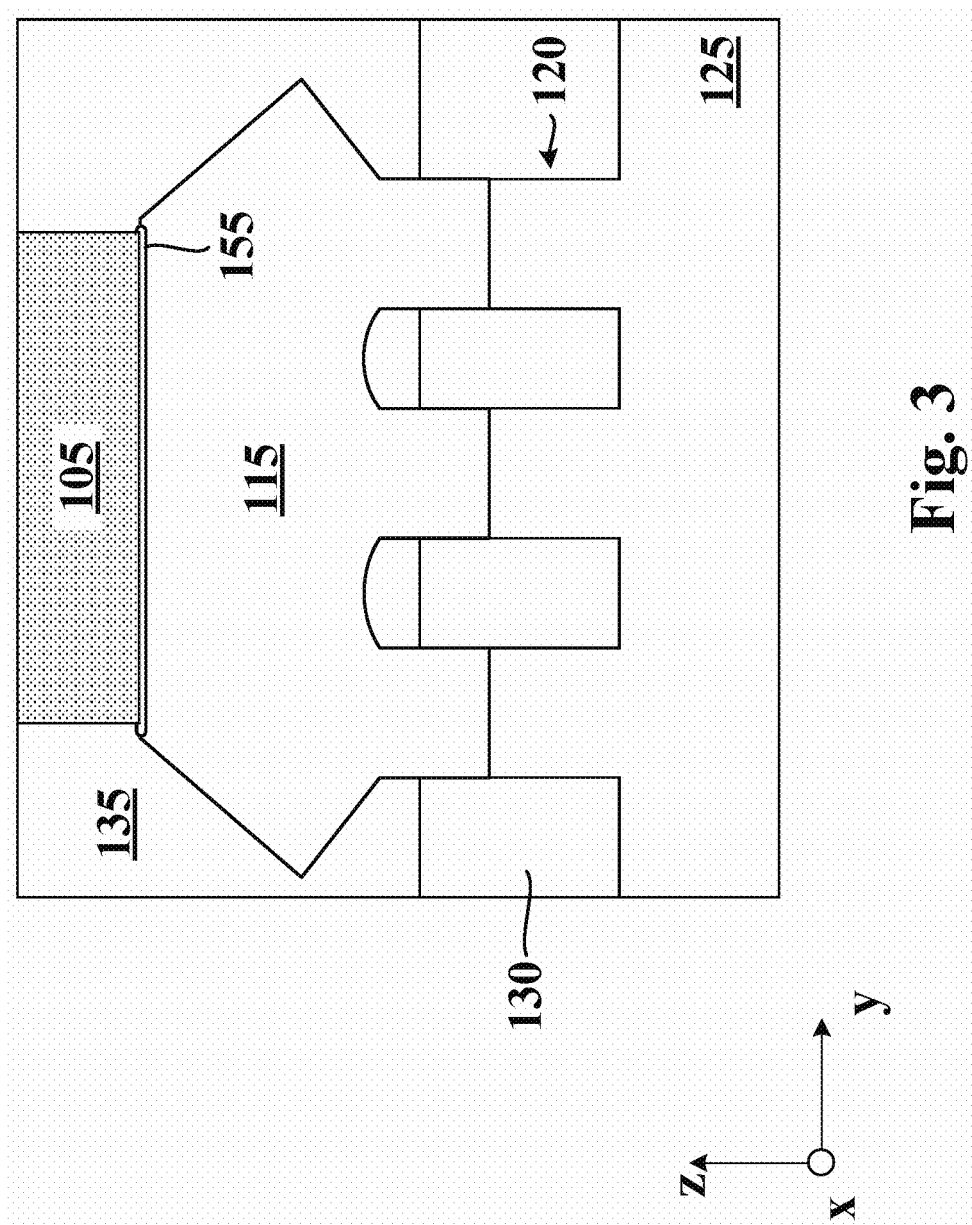
FIGS. 3-7 are cross-sectional views of various fabrication operations during the formation of barrier-free or liner-free conductive structures, in accordance with some embodiments.

In some embodiments, FIG. 3 is an intermediate structure for method 200. In FIG. 3, fin structures 120, first dielectric layer 130, source/drain epitaxial structure 115, silicide layer 155, cobalt conductive structure 105, and second dielectric layer 135 have been previously formed in operations not shown in method 200. In some embodiments, FIG. 3 shows the structure of FIG. 1 after the formation of cobalt conductive structure 105 on silicide layer 155 over source/drain epitaxial structure 115. At the fabrication stage shown in FIG. 3, the top surface of cobalt conductive structure 105 is substantially coplanar with the top surface of second dielectric layer 135. This can be achieved with, for example, a planarization process after the deposition of cobalt metal.

Figure 4:
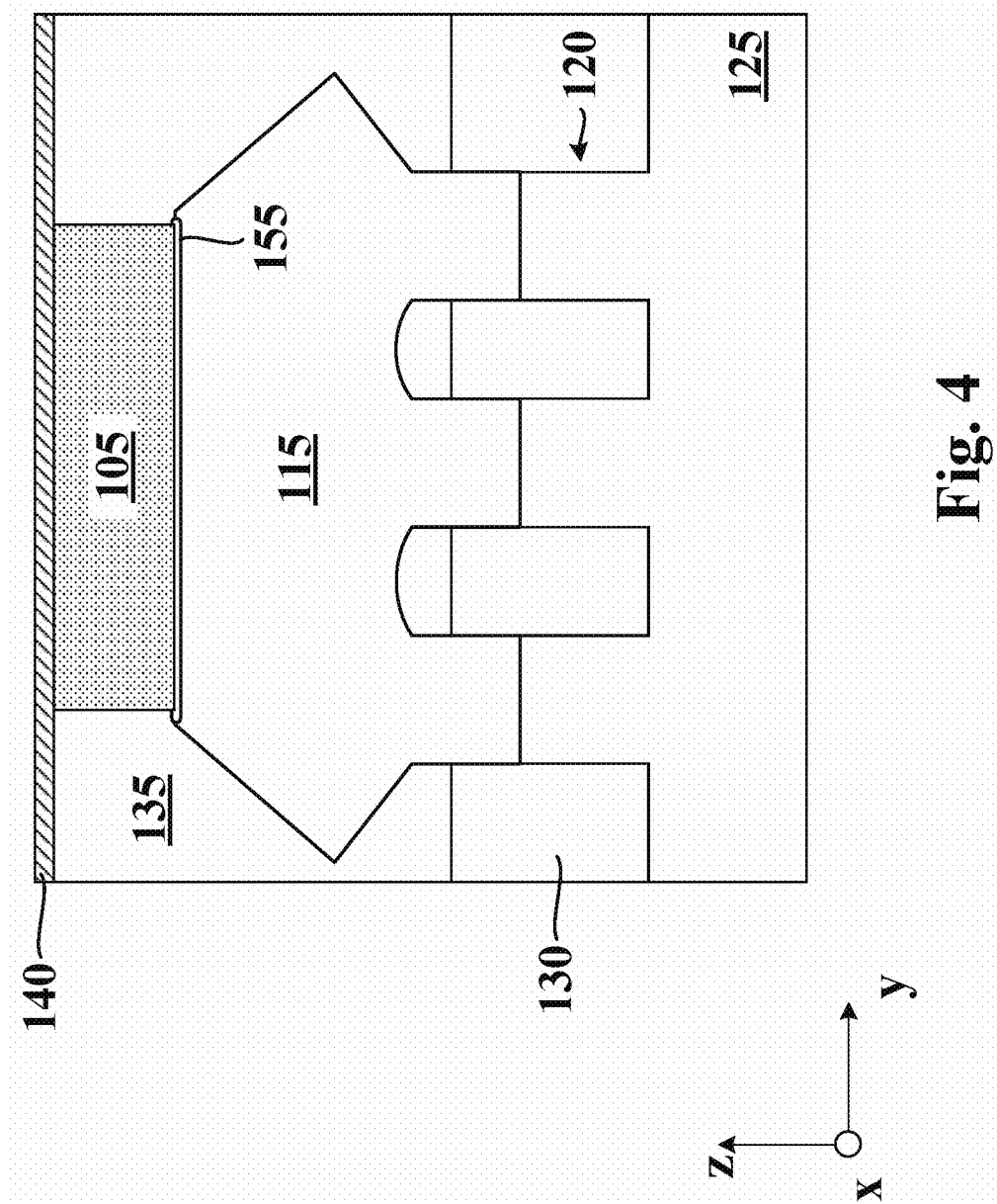

In referring to FIG. 2A, method 200 begins with operation 210 and the process of depositing an etch stop layer (e.g., like etch stop layer 140 shown in FIG. 1) on an underlying conductive structure, like cobalt conductive structure 105. Etch stop layer 140 can be blanket deposited to cover cobalt conductive structure 105 and second dielectric layer 135 as shown in FIG. 4. In some embodiments, etch stop layer 140 facilitates the formation of liner-free conductive structure 100. In some embodiments, etch stop layer 140 can include silicon nitride ($Si_3N_4$), silicon oxynitride (SiON), silicon carbide (SiC), silicon carbo-nitride (SiCN), or any combination thereof. Further, etch stop layer 140 can be deposited by low pressure chemical vapor deposition (LPCVD), plasma enhanced chemical vapor deposition (PECVD), chemical vapor deposition (CVD), atomic layer deposition (ALD), or any other suitable deposition process at a thickness between about 1 nm and about 3 nm.

Figure 5:
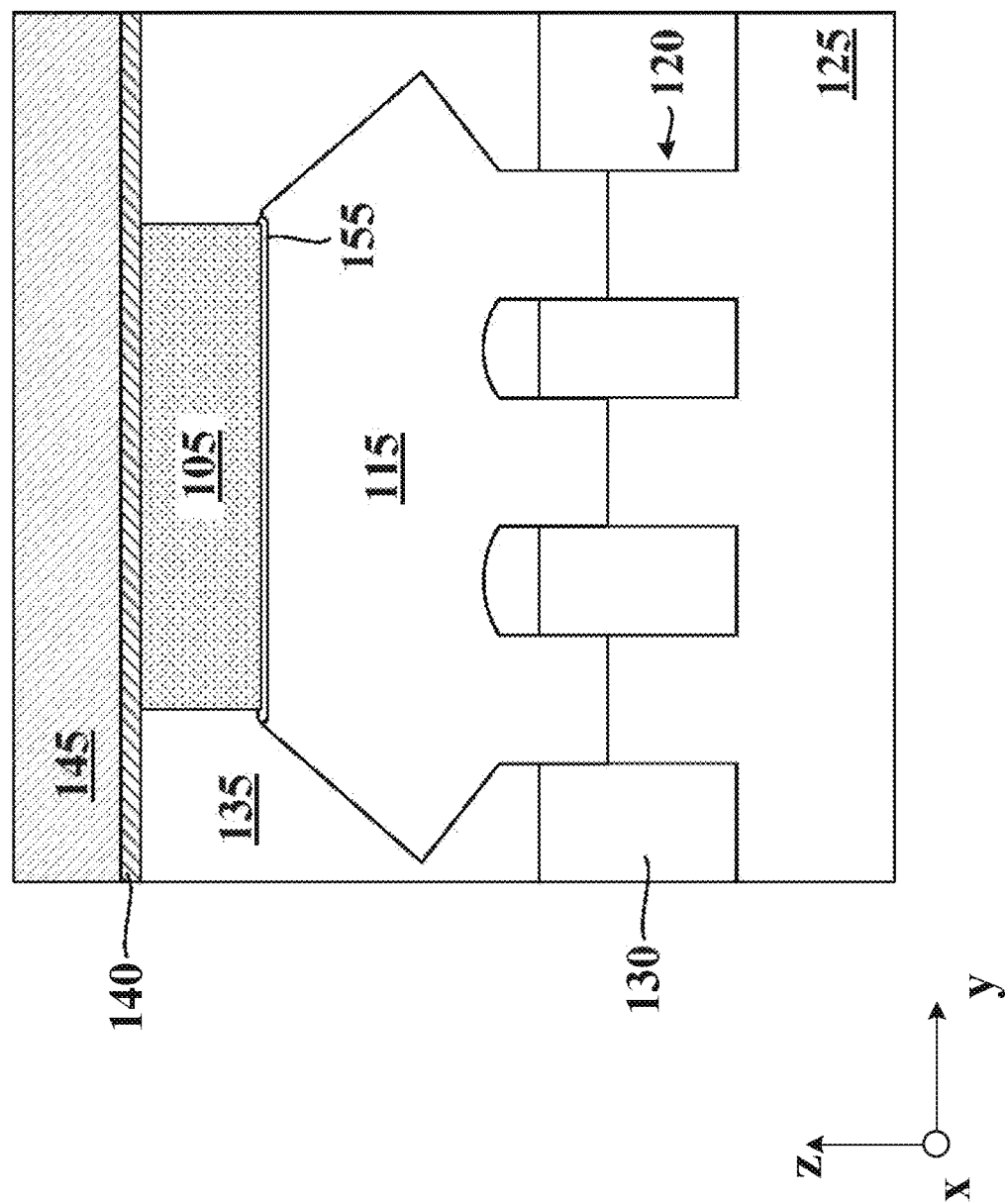

In referring to FIGS. 2A and 5, method 200 continues with operation 220 and the process of depositing ILD 145 on etch stop layer 140. In some embodiments, ILD 145 is a carbon-doped silicon oxide containing hydrogen and nitrogen. By way of example, ILD 145 can be deposited by (CVD), plasma-assisted CVD, PECVD, or any other suitable deposition method. In some embodiments, ILD 145 is a low-k dielectric material with a dielectric constant lower than about 3.9. In some embodiments, ILD 145 can be deposited at a thickness between about 50 nm and about 70 nm depending on the desired aspect ratio of the liner-free conductive structure.

Figure 6:
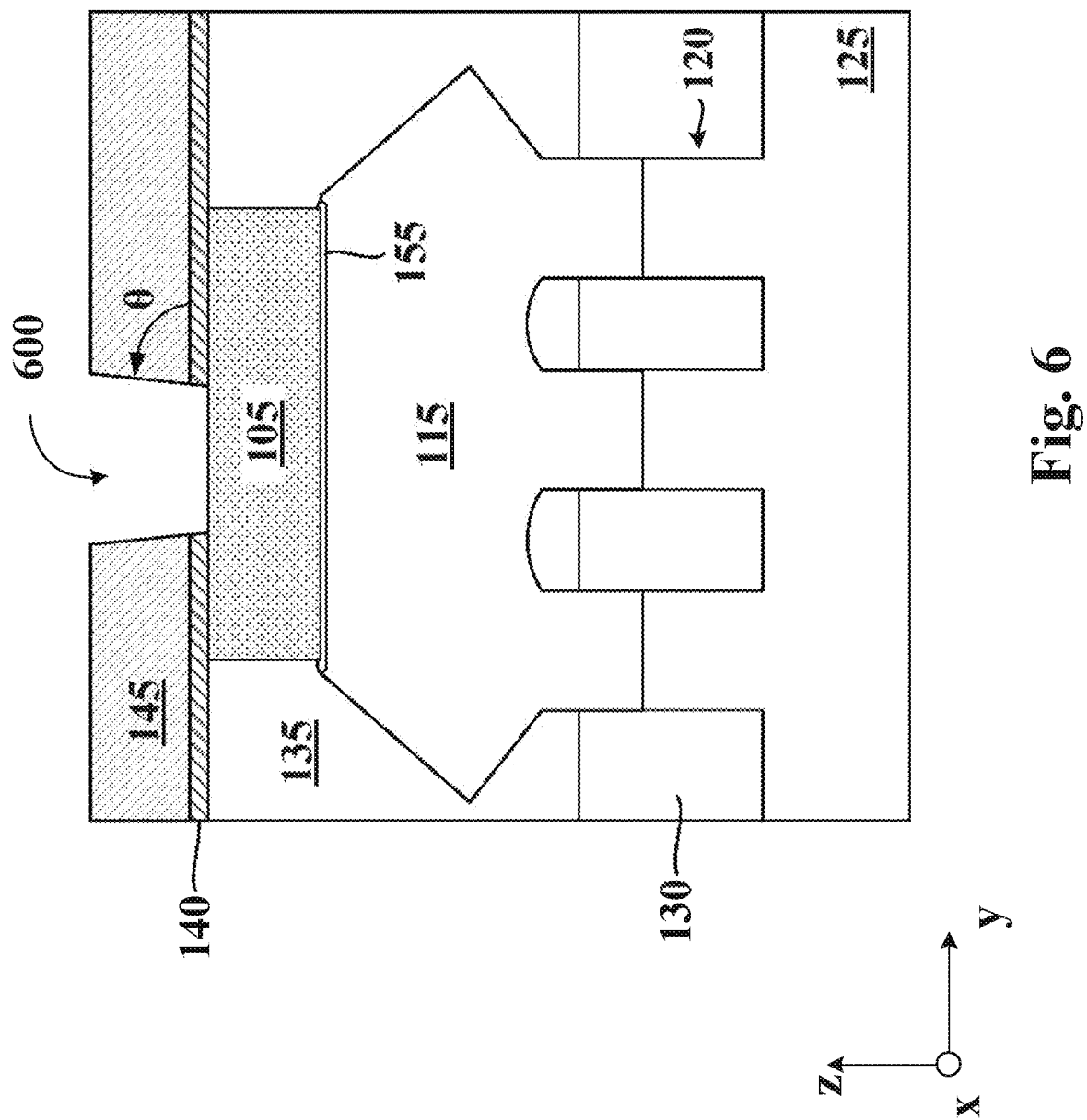

In referring to FIG. 2A, method 200 continues with operation 230 and the process of forming an opening (e.g., a via opening) in ILD 145 and etch stop layer 140 to expose cobalt conductive structure 105. In some embodiments, one or more openings can be formed concurrently to expose portions of cobalt conductive structure 105. In some embodiments, FIG. 6 shows the structure of FIG. 5 after the formation of opening 600 according to operation 230. In some embodiments, opening 600 is a via opening that can be formed with photolithography and etching operations. For example, a photoresist layer can be deposited on ILD 145 and subsequently patterned to form an etch mask. A dry etching process etches portions of ILD 145 and etch stop layer 140 not covered by the photoresist etch mask to form opening 600 shown in FIG. 6. Since ILD 145 and etch stop layer 140 include different materials, a dry chemistry with different etch selectivity for the etched layers can be used. In some embodiments, the dry etch includes two or more sub-operations. For example, a first sub-operation etches ILD 145 and terminates on etch stop layer 140, and a second sub-operation etches etch stop layer 140 and terminates on cobalt conductive structure 105. Additional sub-operations can be used to over-etch cobalt conductive structure 105 and/or to remove a polymer formed during the etching processes. In some embodiments, ILD 145 and etch stop layer 140 can be etched with a different etching chemistry.

In some embodiments, sidewall angle θ measured between a sidewall of opening 600 and horizontal direction y (e.g., parallel to the top surface of cobalt conductive structure 105), is modulated via the etching process conditions and can range from about 85° to about 90°. Therefore, the top width of opening 600 can be substantially equal to or larger than the bottom width of opening 600. In some embodiments, the aspect ratio (e.g., height/top width) of opening 600 can range between about 3 and about 4. This is not limiting and more aggressive or less aggressive aspect ratios are possible.

Figure 7:
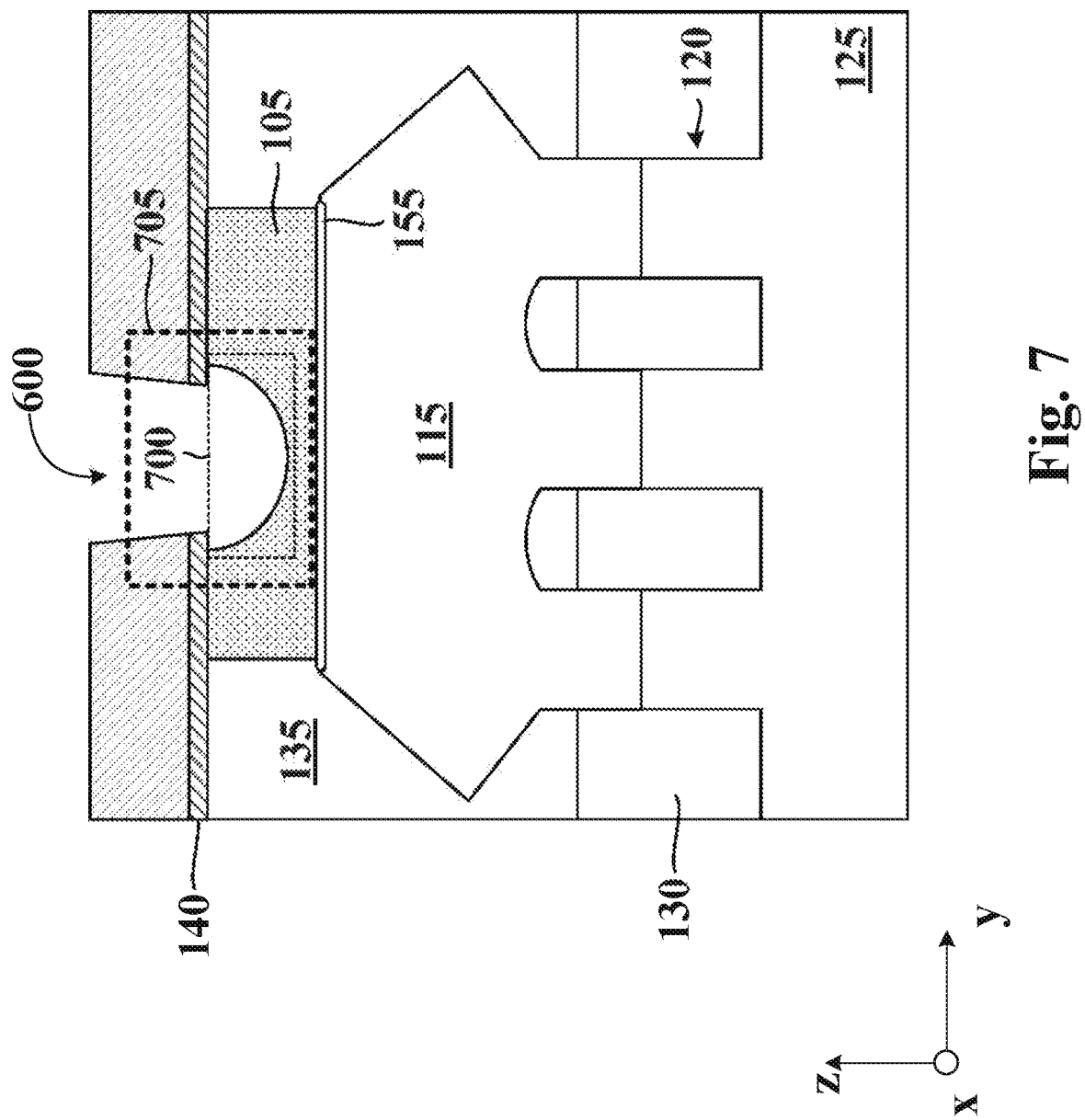

In referring to FIG. 2A, method 300 continues with operation 240 and the process of etching the exposed cobalt conductive structure 105 with a wet etching process to form an anchor recess. In some embodiments, FIG. 7 shows the structure of FIG. 6 after the wet etching process according to operation 240. In some embodiments, the etching chemistry includes an aqueous solution of butoxyethanol ($C_6H_{14}O_2$), hydroxylamine ($H_3NO$), and diethylenetriaminepentaacetic acid ($C_{14}H_{23}N_3O_{10}$), in which the main etchant is water while $C_6H_{14}O_2$, $H_3NO$, and $C_{14}H_{23}N_3O_{10}$ function as cobalt surface protectants. The wet etching chemistry is selective to cobalt and isotropically etches the exposed cobalt metal in all directions (e.g., x-, y-, and z-directions). As a result, a semi-spherical anchor recess 700 is formed on a top portion of cobalt conductive structure 105 as shown in FIG. 7.

Figure 8A:
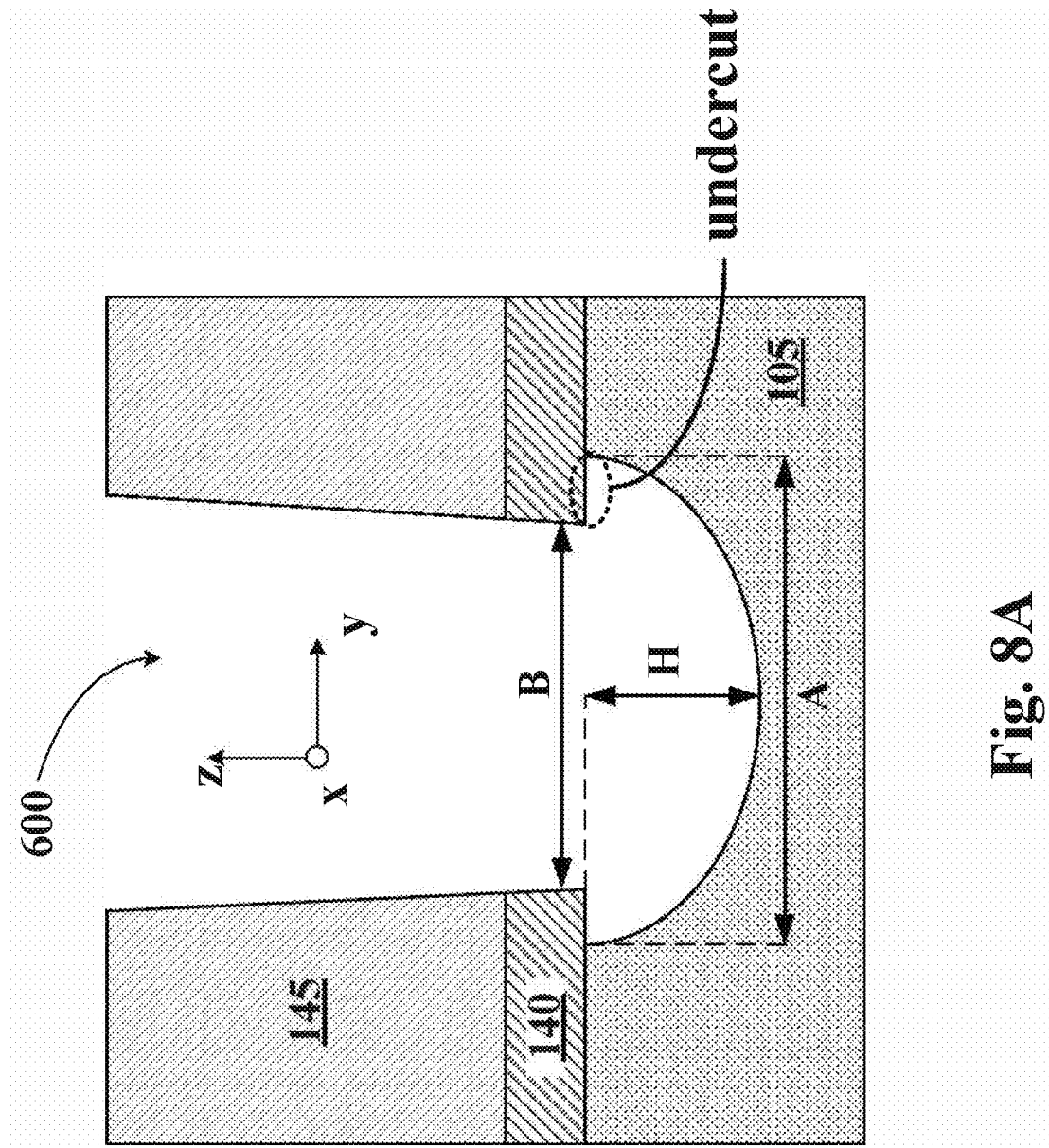
FIG. 8A is a magnified cross-sectional view of a via opening over a cobalt conductive structure, in accordance with some embodiments.

In some embodiments, the exposure of cobalt conductive structure 105 to the wet etching chemistry is timed to control the size of semi-spherical anchor recess 700. For example, the exposure time can range from about 50 s to about 100 s or more depending on the etch rate and the desired size of semi-spherical anchor recess 700. FIG. 8A is a magnified view of semi-spherical anchor recess 700 included within dashed box 705 shown in FIG. 7. In some embodiments, semi-spherical anchor recess 700 has a width A along the y-direction between about 21 nm and about 39 nm and a height H between about 7 nm and about 13 nm. In some embodiments, a ratio A/H is about 3. The aforementioned ranges are not limiting and a larger or a smaller semi-spherical anchor recess 700 can be formed. In some embodiments, a larger semi-spherical anchor recess 700 can be harder to fill in a subsequent operation and a smaller semi-spherical anchor recess 700 may not prevent metal pull-out. According to some embodiments, width A of semi-spherical anchor recess 700 is larger than bottom width B of opening 600 (e.g., A>B), which ranges between about 13 nm and about 15 nm. In some embodiments, a ratio A/B ranges between about 1.7 and about 2.6, and a ratio B/H ranges between about 1 and 2. An undercut having a width along the y-direction of about (A−B)/2 is formed on each side of semi-spherical anchor recess 700 below etch stop layer 140. In some embodiments, the undercut ranges between about 4 nm and about 12 nm.

Figure 8B:
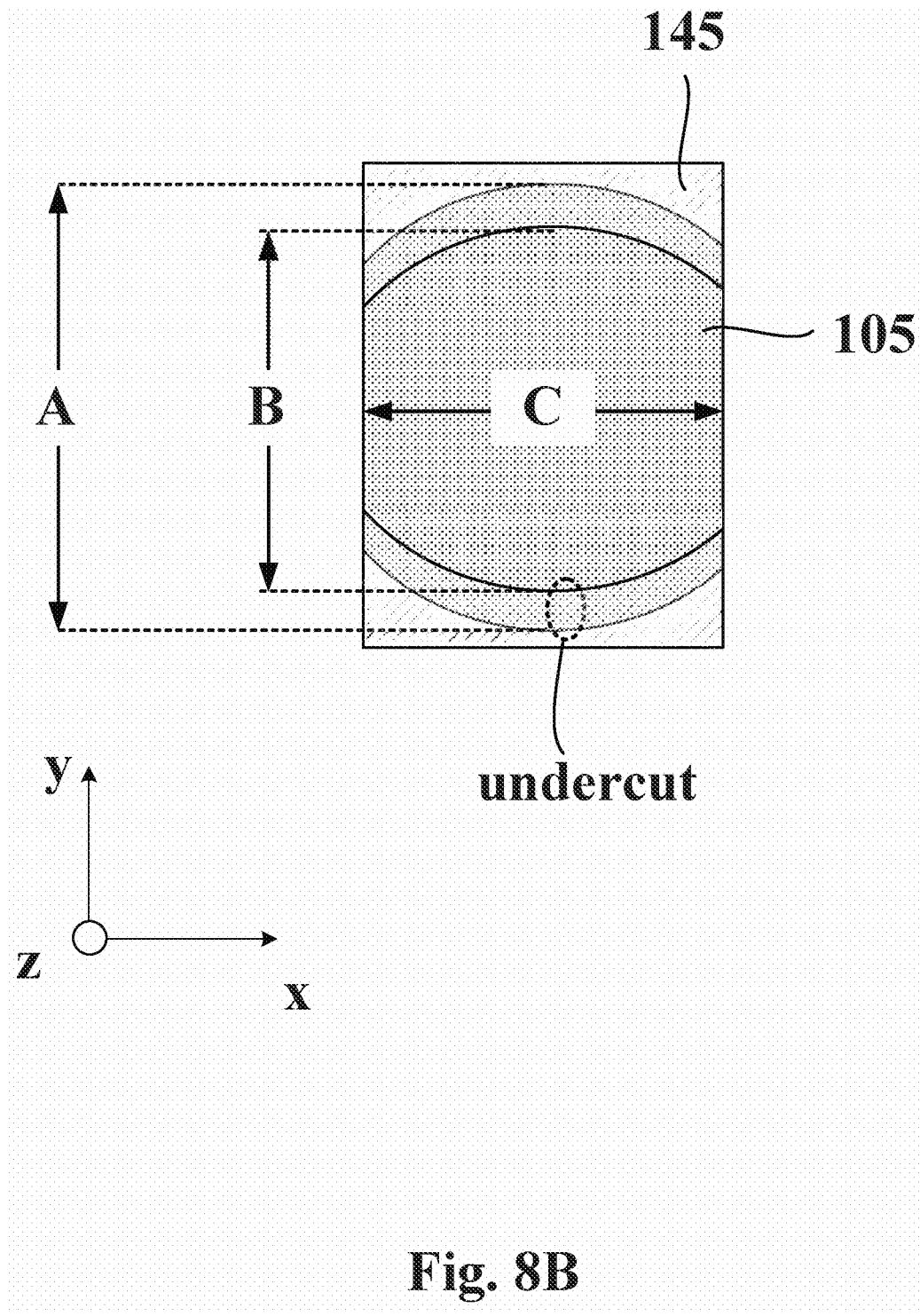
FIG. 8B, is a magnified top view of a via opening over a cobalt conductive structure, in accordance with some embodiments.

In some embodiments, the width of semi-spherical anchor recess 700 along the x-direction (not shown in FIG. 8A) can be different than width A along the y-direction due to the smaller dimensions of cobalt structure 105 along the x-direction. This is shown in FIG. 8B, which is a top-view of semi-spherical anchor recess 700 through opening 600, where width C of semi-spherical anchor recess 700 along the x-direction is restricted by the physical width of cobalt conductive structure 105 and is smaller than width A along the y-direction. In other words, the anchor recess appears to have a semi-spherical shape when viewed perpendicular to width C (e.g., like in FIG. 8A) and a rectangular shape when viewed in a cross-section perpendicular to width C.

Semi-spherical anchor recess 700 can serve two purposes: (1) offer an anchor point for the metal fill to prevent pull-out of the metal fill (e.g., used to fill opening 600) during a subsequent planarization process, and (2) increase the contact area between the underlying cobalt conductive structure and the metal fill to improve the overall contact resistance.

Figure 9:
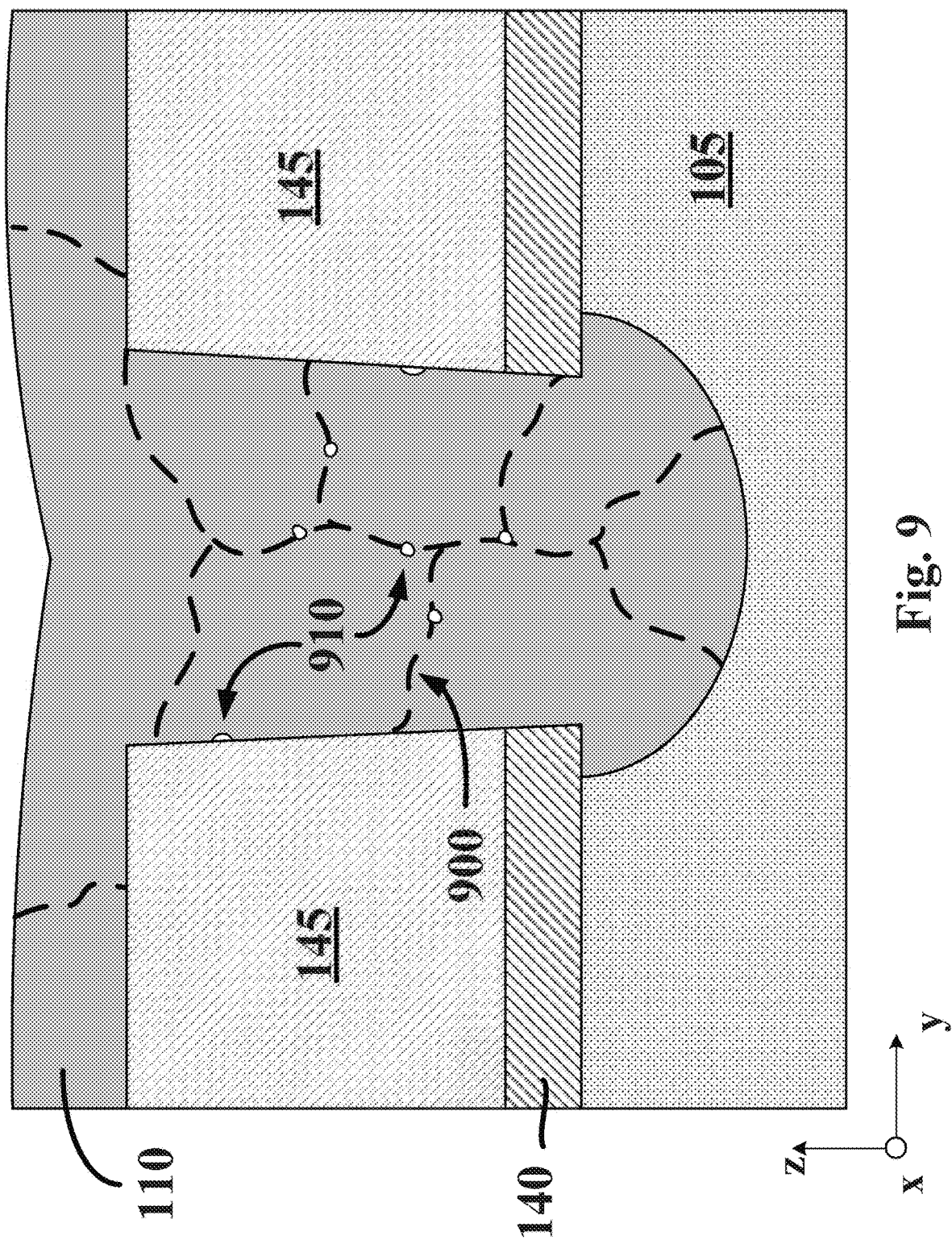
FIGS. 9 and 10 are magnified cross-sectional views of various fabrication operations during the formation of a barrier-free or liner-free conductive structure, in accordance with some embodiments.

In referring to FIG. 2B, method 200 continues with operation 250 and the process of depositing a metal to fill opening 600. In some embodiments, the metal in operation 250 is directly deposited on cobalt structure 105 without a prior deposition of a liner or a barrier layer. In some embodiments, the metal in operation 250 includes ruthenium deposited with a thermal CVD process at a temperature below about 200° C. (e.g., about 180° C.) using a ruthenium carbonyl precursor chemistry, such as triruthenium dodecacarbonyl ($Ru_3(CO)_{12}$). In some embodiments, the ruthenium metal is deposited at a thickness of about 20 nm or at thickness sufficient to substantially fill opening 600, including semi-spherical anchor recess 700. According to some embodiments, FIG. 9 is a magnified view of FIG. 8A after operation 250 and the deposition of ruthenium metal 110 in fill opening 600. In some embodiments, the as-deposited ruthenium metal 110 extends over ILD 145 outside opening 600 and forms an "overburden" which is removed with a planarization process in a subsequent operation.

The deposited ruthenium metal 110 has a polycrystalline microstructure consisting of coalesced ruthenium grains with grain boundaries 900 formed between abutting ruthenium grains. In some embodiments, ruthenium metal 110 may also include fill voids 910 formed at or near the grain boundary locations and/or on sidewall surfaces as shown in FIG. 9. The location, the number, and the size of grain boundaries 900 and fill voids 910 shown in FIG. 9 are not limiting. Therefore, additional grain boundaries 900 and fill voids 910 formed at different locations and with different sizes/shapes are within the spirit and the scope of this disclosure.

In some embodiments, subsequent processes having sufficient thermal budget (e.g., greater than about 250° C.) can result in thermal out-diffusion of cobalt atoms from cobalt conductive structure 105 to ruthenium metal 110 through the ruthenium grain boundaries 900. In some embodiments, thermally diffused cobalt atoms accumulate along grain boundaries 900 and/or in fill voids 910. Thermally out-diffused cobalt atoms described above form voids within cobalt conductive structures 105. For example, the voids in cobalt conductive structure 105 caused by the cobalt out-diffusion process can have a width (e.g., along the x-direction, the y-direction, or combinations thereof) of about 55 nm and a height (e.g., in the z-direction) of about 26 nm. Aside from cobalt voids within cobalt conductive structure 105, cobalt out-diffusion is not desirable because diffused cobalt increases the overall contact resistance.

Figure 10:
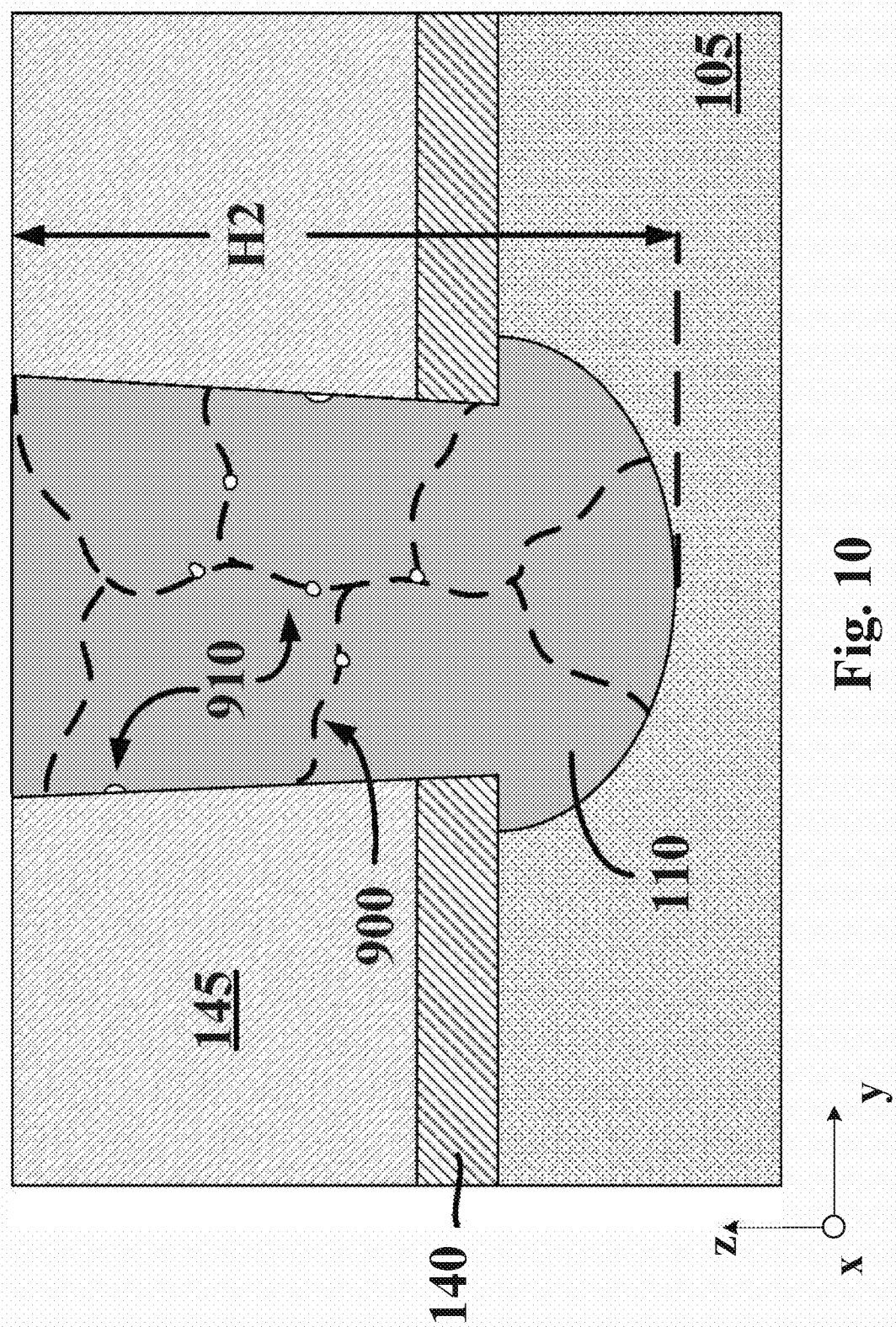

In some embodiments, ruthenium metal 110 is planarized so that the top surface of ruthenium metal 110 and the top surface of ILD 145 are substantially coplanar as shown in FIG. 10. In some embodiments, the planarization process is a chemical mechanical polishing (CMP) process that removes excess ruthenium metal deposited on ILD 145 and planarizes the top surface of the resulting structure. In some embodiments, the planarization process reduces the height of ILD 145 to about half, or less than half, of its original height. For example, if the original height of ILD 145 was about 50 nm, the height of ILD 145 after the planarization process of operation 250 can be reduced to about 30 nm or less (e.g., to about 20 nm). This height reduction can change the aspect ratio of the formed liner-free conductive structure 100.

Figure 11:
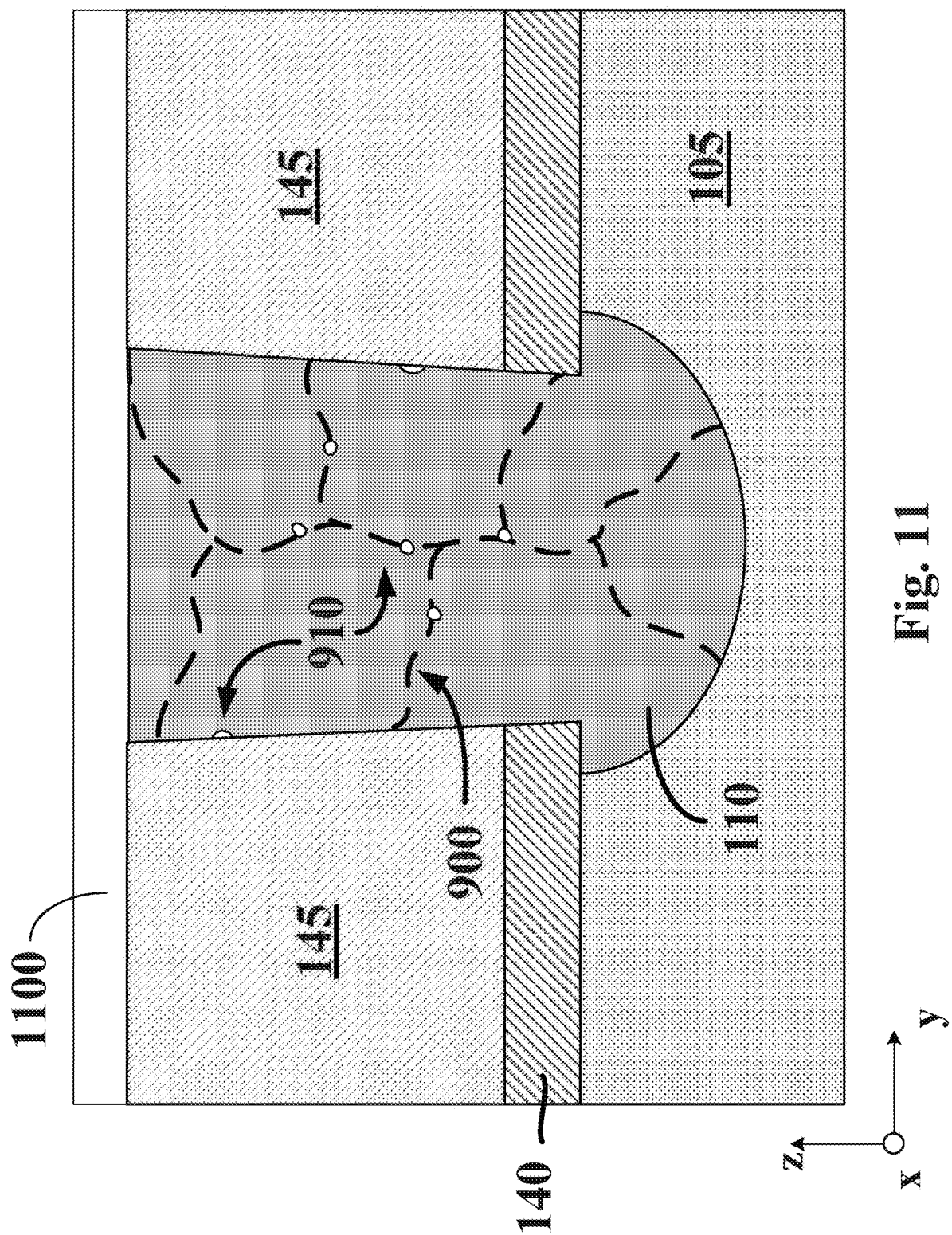
FIG. 11 is magnified cross-sectional view of a cobalt layer formed on a barrier-free or liner-free conductive structure, in accordance with some embodiments.

In referring to FIGS. 2B and 11, method 200 continues with operation 260 and the process of depositing a cobalt layer 1100 on the metal fill (e.g., ruthenium metal 110). In some embodiments, the thickness of the deposited cobalt layer 1100 is between about 5 nm and about 20 nm. In some embodiments, cobalt layer 1100 can be deposited with a plasma-enhanced chemical vapor deposition (PECVD) process or another suitable deposition process at a temperature range between about 160° C. and about 260° C., using a cobalt carbonyl precursor (e.g., cyclopentadienyl-cobalt dicarbonyl) and ammonia ($NH_3$) plasma.

Figure 12:
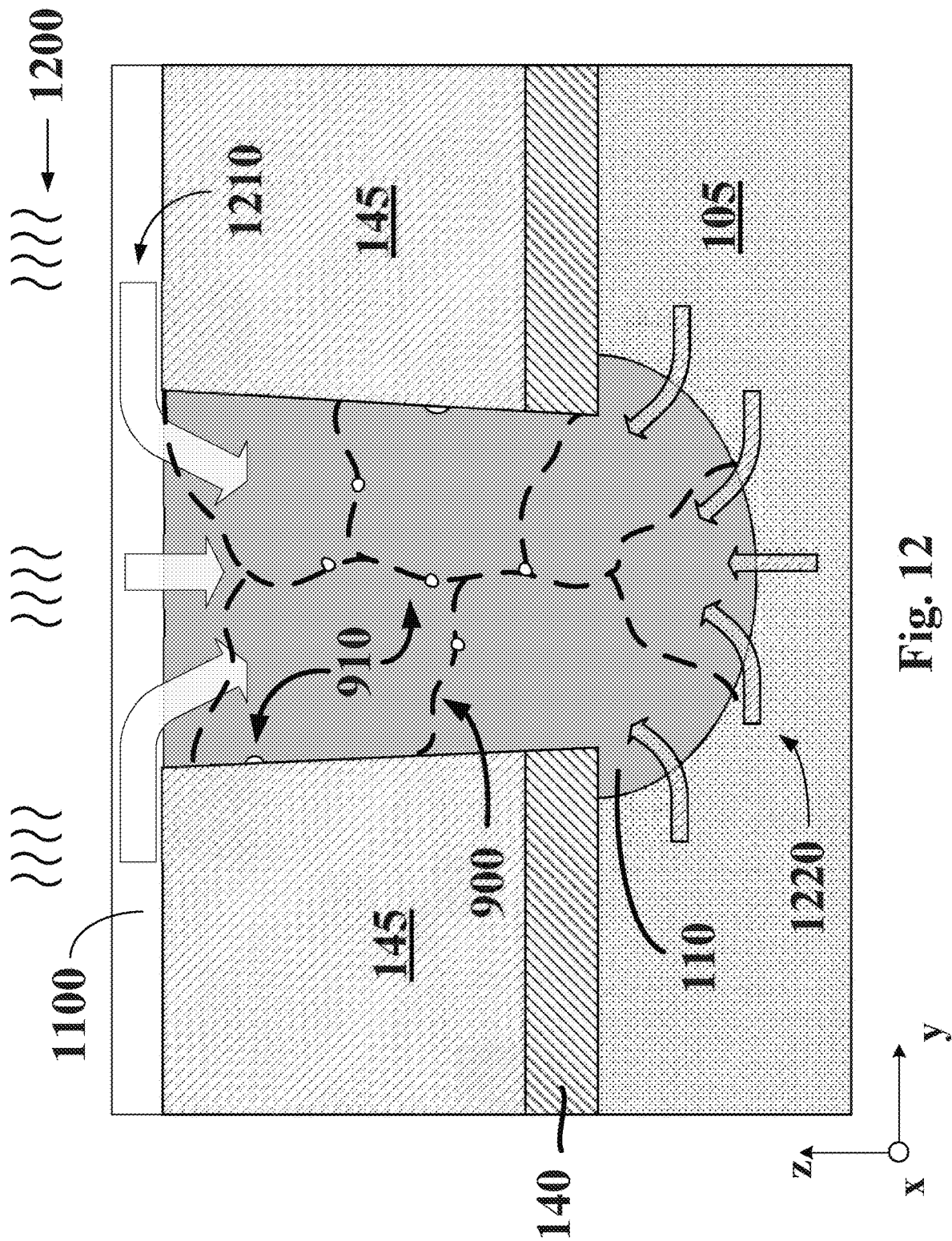
FIG. 12 is magnified cross-sectional view of a cobalt layer formed on a barrier-free or liner-free conductive structure during a heat treatment, in accordance with some embodiments.

In referring to FIG. 2B, method 200 continues with operation 270 and the process of exposing ruthenium metal 110 to a heat treatment. In some embodiments, the heat treatment is performed at a temperature greater than about 250° C. (e.g., at about 300° C.). In some embodiments, the annealing ambient includes nitrogen ($N_2$), argon (Ar), helium (He), hydrogen ($H_2$), forming gas (e.g., a mixture of hydrogen and nitrogen), or any combinations thereof. An oxidizing ambient is not desirable because it can partially convert ruthenium metal 110 to ruthenium oxide, which has a higher electrical resistivity than ruthenium metal. In referring to FIG. 12, during the heating treatment indicated by wavy lines 1200, cobalt atoms from cobalt layer 1100 diffuse into ruthenium metal 110 as indicated by arrows 1210. Cobalt diffusion can also occur from cobalt conductive structure 105 as indicated by arrows 1220. As discussed above, grain boundaries 900 become diffusion pathways for the thermally diffused cobalt atoms. In some embodiments, diffused cobalt atoms accumulate along grain boundaries 900 and within fill voids 910 of ruthenium metal 110. According to some embodiments, the flux of diffused cobalt atoms from cobalt conductive structure 105 is substantially reduced since cobalt layer 1100 functions as a secondary reservoir for cobalt atom diffusion. Consequently, saturation within ruthenium metal 110 is reached sooner, and void formation within cobalt conductive structure 105 is prevented or substantially mitigated.

In some embodiments, cobalt out-diffusion is not layer thickness dependent. Therefore, a cobalt layer 1100 with a thickness greater than about 20 nm does not offer additional cobalt out-diffusion benefits; to the contrary, a cobalt layer 1100 with a thickness greater than about 20 nm unnecessarily increases the fabrication cost.

Figure 13:
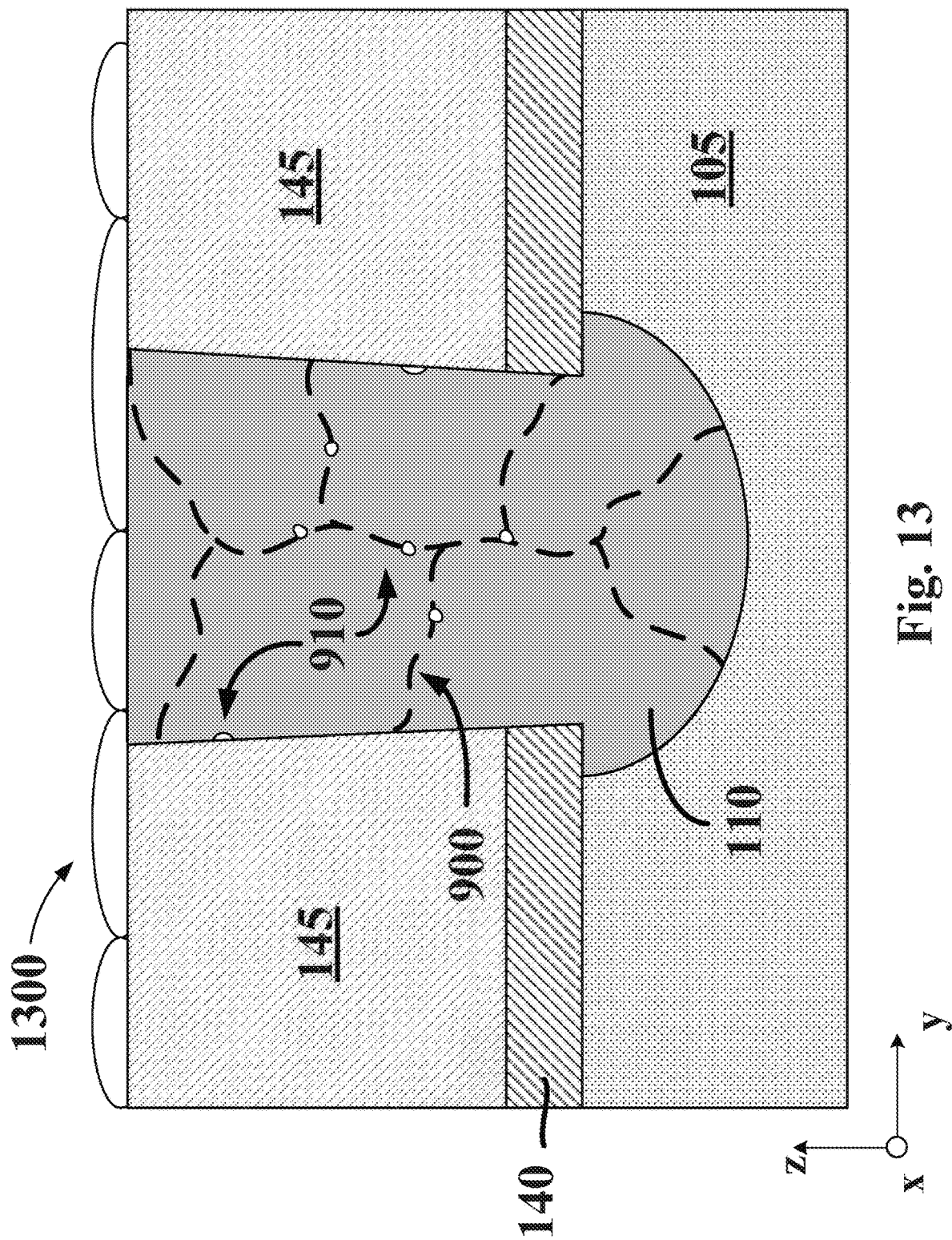
FIG. 13 is magnified cross-sectional view of a non-coalesced cobalt layer formed on a barrier-free or liner-free conductive structure, in accordance with some embodiments.

On the other hand, cobalt layers thinner than about 5 nm do not form a continuous layer. For example, in referring to FIG. 13, cobalt grains 1300 are not grown to the point where they can coalesce (e.g., merge) into a continuous layer when the cobalt layer growth is interrupted before it reaches a thickness of about 5 nm. In some embodiments, during operation 270, cobalt atoms from a non-coalesced cobalt "layer" are still capable of out-diffusing towards ruthenium metal 110 like a fully coalesced layer, such as cobalt layer 1100 shown in FIG. 12. Therefore, in some embodiments, cobalt layer 1100 shown in FIG. 11 is not required to be continuous. For example, cobalt layer 1100 can be a contiguous layer formed by cobalt grains 1300 (e.g., as shown in FIG. 13) and have a cobalt "layer" thickness less that about 5 nm.

In some embodiments, the heat treatment of operation 270 also promotes the growth of the ruthenium grains within ruthenium metal 110 and, consequently, reduces the number of grain boundaries 900. Grain growth is desirable because ruthenium metal with larger grains exhibits a lower electrical resistance compared to ruthenium metal with smaller grains. This is because a metal with large grains has fewer grain boundaries—e.g., locations for electron scattering— compared to a metal with small grains. In some embodiments, as the grains of ruthenium metal 110 grow, fill voids 910 are eliminated or undergo a size reduction, the number of grain boundaries 900 reduces, and cobalt out-diffusion from cobalt layer 1100 and cobalt conductive structures 105 ceases. Therefore, out-diffusion of cobalt from cobalt layer 1100 and cobalt conductive structures 105 is restricted both because it reaches a saturation point, and because the number of grain boundaries 900 and fill voids 910 reduces during the heat treatment of operation 270.

In some embodiments, a critical parameter is the volume ratio between opening 600 shown in FIG. 8A and cobalt 105 (also referred to herein as "volume ratio 600/105"). For example, a volume ratio 600/105 less than about 0.2 may not require a cobalt layer 1100 since cobalt out-diffusion form cobalt conductive structure 105 is limited and voids within cobalt conductive structure 105 can be avoided during the heat treatment according to operation 270. For a volume ratio 600/105 greater than about 0.2, the cobalt layer 1100 formation may be necessary to reduce cobalt out-diffusion form cobalt conductive structure 105 and the formation of voids within cobalt conductive structure 105. In some embodiments, if the volume ratio 600/105 is greater than about 0.8, the volume of ruthenium metal 110 will need to be reduced to avoid excessive cobalt out-diffusion as will be discussed below with respect to FIGS. 16A-C, 17A-C, and 18A-C.

In referring to FIG. 2B, method 200 continues with operation 280 and the process of removing cobalt layer 1100. In some embodiments, cobalt layer 1100 is removed from ILD 145 and ruthenium metal 110 with a planarization process, such as a CMP process, or an etching process selective towards cobalt—e.g., a wet etching process, a dry etching process, or combinations thereof.

Figure 14:
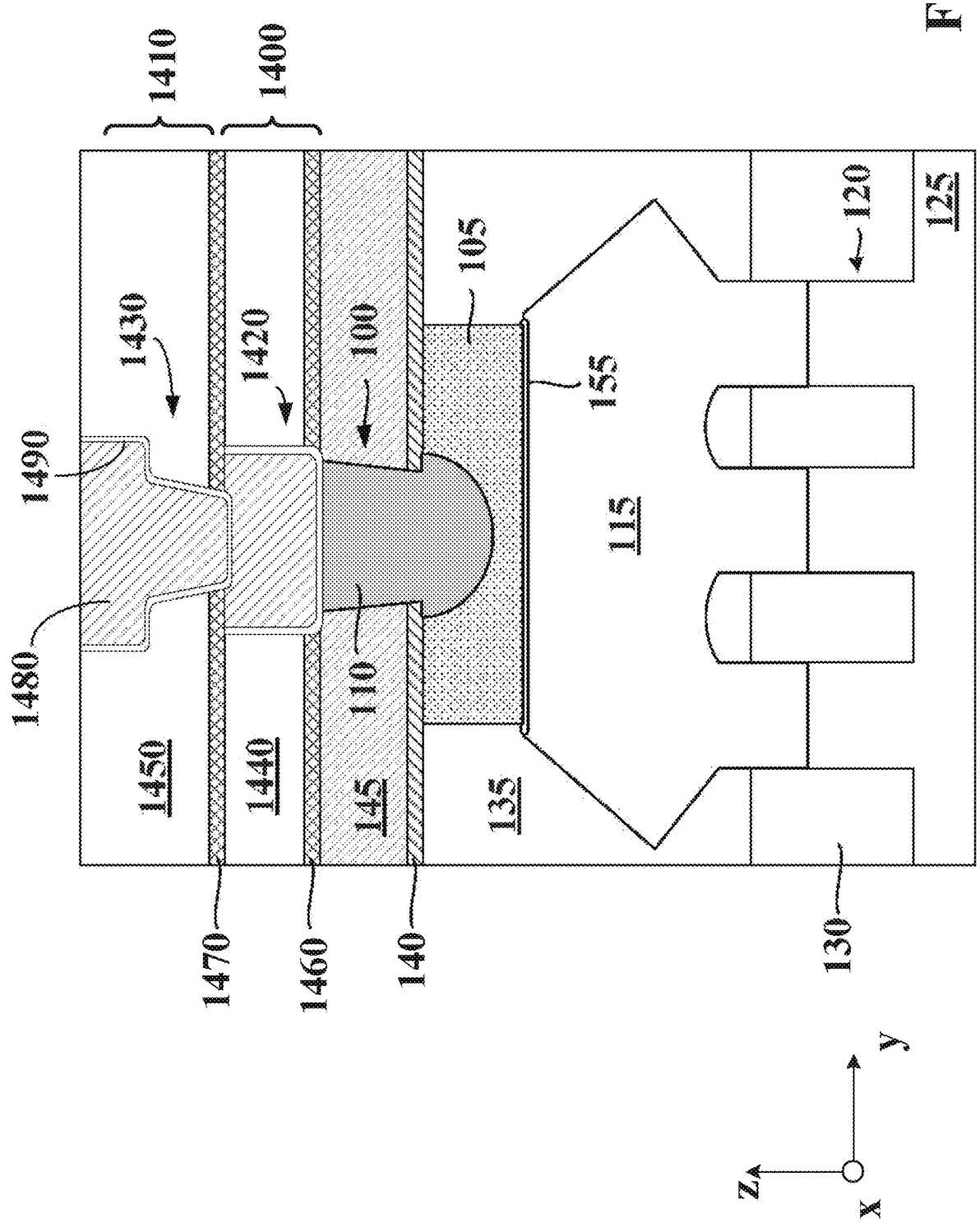
FIG. 14 is a cross-sectional view of metallization layers over barrier-free or liner-free conductive structures, in accordance with some embodiments.

In referring to FIG. 2B, method 200 continues with operation 290 and the process of forming one or more metallization layers on ILD 145. In some embodiments, FIG. 14 shows the structure of FIG. 1 after operation 280 where metallization layers 1400 and 1410 are successively formed on ILD 145. According to some embodiments, metallization layers 1400 and 1410 are back-end-of-line (BEOL) metallization layers, which include copper conductive structures 1420 and 1430 embedded respectively in dielectric layers 1440 and 1450. Metallization layers 1400 and 1410 further include metal oxide etch stop layers 1460 and 1470 which facilitate the formation of copper conductive structures 1420 and 1430.

In some embodiments, copper conductive structures 1420 and 1430 include copper fill 1480 surrounded by a liner layer 1490. In some embodiments, liner layer 1490 can include a barrier layer (e.g., tantalum nitride (TaN)) and a metal layer (e.g., tantalum or cobalt) on which copper fill 1480 can be formed. According to some embodiments, dielectric layers 1440 and 1450 include a stack of dielectric layers, such as a low-k dielectric and another dielectric. For example, dielectric layers 1440 and 1450 can include: (i) a low-k dielectric (e.g., carbon-doped silicon oxide) and a silicon carbide with nitrogen doping; (ii) a low-k dielectric (e.g., carbon-doped silicon oxide) and a silicon carbide with oxygen doping; (iii) a low-k dielectric (e.g., carbon doped silicon oxide) with silicon nitride; or (iv) a low-k dielectric (e.g., carbon-doped silicon oxide) with silicon oxide.

In some embodiments, metal oxide etch stop layers 1460 and 1470 have a thickness of about 3 nm and can include, for example aluminum oxide ($Al_2O_3$). In some embodiments, metal oxide etch stop layers 1460 and 1470, besides facilitating the formation of copper conductive structures 1420 and 1430, are able to suppress cobalt out-diffusion from the top surface of liner-free conductive structure 100 during subsequent thermal processes (e.g., during subsequent material depositions, thermal treatments, wet cleans, etching operations, etc.) performed at temperatures greater than about 250° C.

Figure 15A:
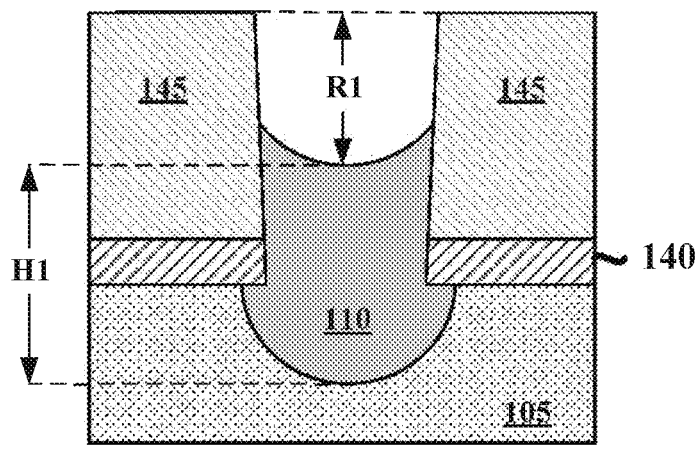
FIGS. 15A-C are magnified cross-sectional views of various fabrication operations during the formation of a barrier-free or liner-free conductive structure, in accordance with some embodiments.

In some embodiments, instead of polishing down the as-deposited ruthenium metal 110 as shown in FIGS. 9 and 10, ruthenium metal 110 can be selectively etched-back as shown in FIG. 15A. For example, an etch-back process may be preferred over a polishing process if the volume ratio 600/105 is greater than about 0.8 as discussed above. Because of the etch-back process, ruthenium metal 110 is recessed by a recess height R1 with respect to the surrounding ILD 145. In some embodiments, recess height R1 is controlled via the etch-back process conditions, such as the etching time. In some embodiments, the recess height R1 is adjusted so that the recessed ruthenium metal 110 shown in FIG. 15A has a height H1 that is substantially equal to height H2 of polished or planarized ruthenium metal 110 shown in FIG. 10 (e.g., H1≈H2).

In some embodiments, the etch-back process includes a wet etching chemistry, such as hypochlorous acid (HClO). In some embodiments, the etch-back process, due to its isotropic nature, forms a concave top surface on ruthenium top metal 110 as shown in FIG. 15A.

Figure 15B:
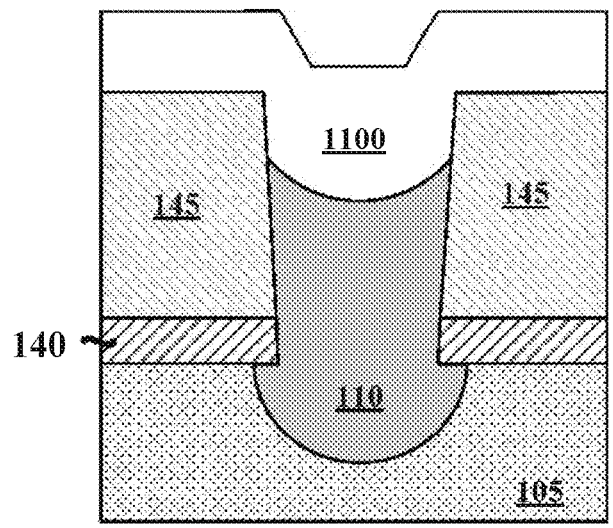
Figure 15C:
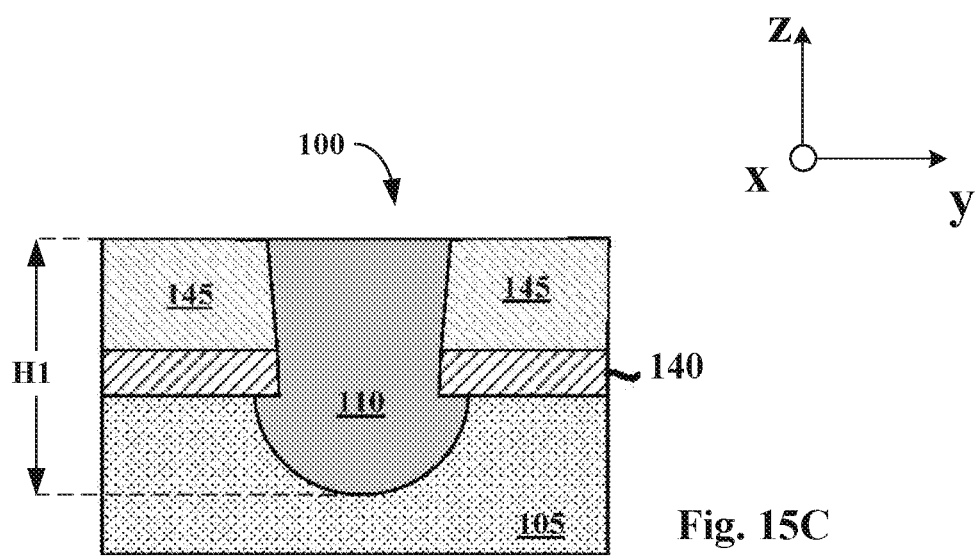

Subsequently, cobalt layer 1100 is blanket deposited on the recessed (e.g., etched) ruthenium metal 110 as shown in FIG. 15B. The structure is subjected to a heat treatment as described in operation 270 of method 200 shown in FIG. 2B so that cobalt from cobalt layer 1100 can diffuse into the recessed ruthenium metal 110. A CMP process planarizes (e.g., polishes down) cobalt layer 1100 and a portion of ILD 145 to form liner-free or barrier-free conductive structure 100 with height H1 as shown in FIG. 15C. Because of the aforementioned CMP process, the top surface conductive structure 100 is coplanar with the top surface of ILD 145 as shown in FIG. 15C.

Figure 16A:
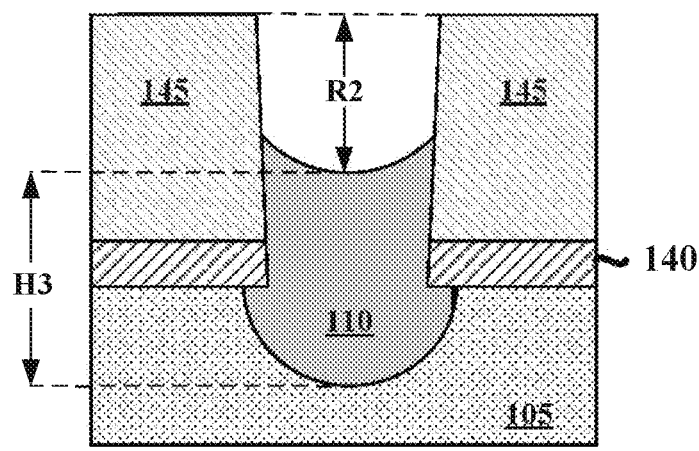
FIGS. 16A-C are magnified cross-sectional views of various fabrication operations during the formation of a barrier-free or liner-free conductive structure, in accordance with some embodiments.
Figure 16B:
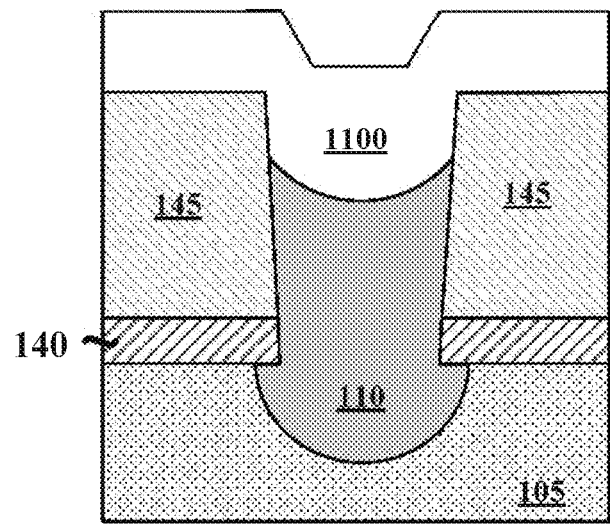
Figure 16C:
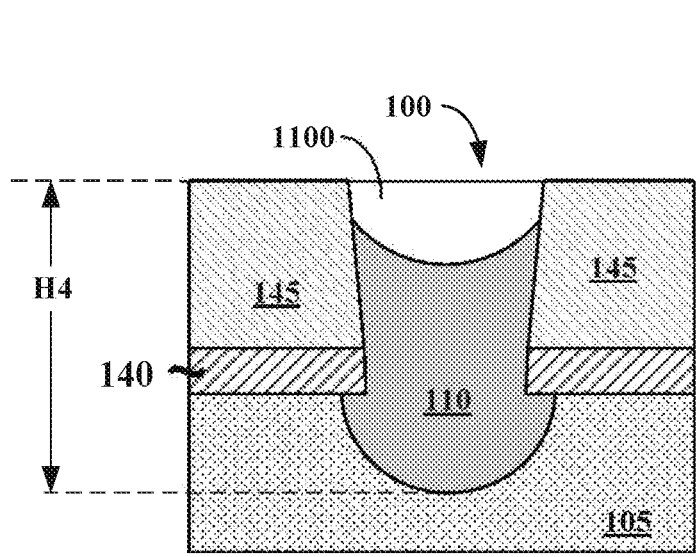

In some embodiments, the etch-back process recesses ruthenium metal to a height H3 as shown in FIG. 16A shorter than height H2 shown in FIG. 10 (e.g., H3<H2). Recess height R2 is taller than recess height R1 (e.g., R2>R1). Subsequently, cobalt layer 1100 is blanket deposited on the recessed ruthenium metal 110 as shown in FIG. 16B. The structure is subjected to a heat treatment as described in operation 270 of method 200 shown in FIG. 2B so that cobalt from cobalt layer 1100 can diffuse into the recessed ruthenium metal 110. A CMP process planarizes (e.g., polishes down) cobalt layer 1100 and a portion of ILD 145 as shown in FIG. 16C to form conductive structure 100 with a height H4—substantially equal to height H2 shown in FIG. 10. A difference between FIGS. 15C and 16C is that in the case of FIG. 16C a portion of cobalt layer 1100 is integrated in the resulting conductive structure.

Based on the above, it is possible to control what portion of cobalt layer 1100 will be integrated into the resulting liner-free or barrier-free conductive structure by controlling recess heights R1 and R2 shown respectively in FIGS. 15A and 16A.

Figure 17A:
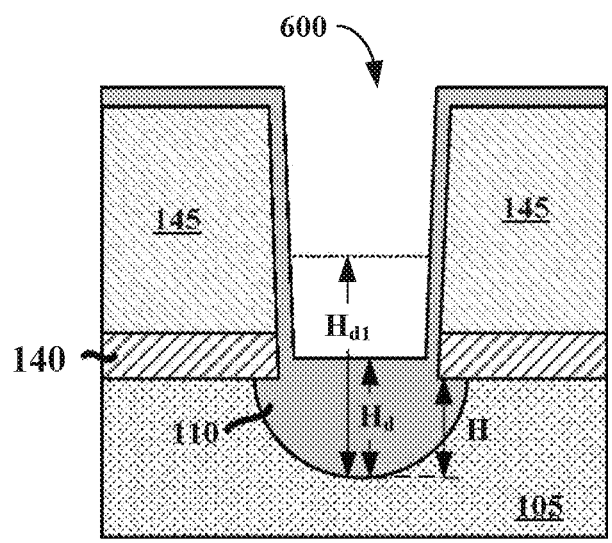
FIGS. 17A-C are magnified cross-sectional views of various fabrication operations during the formation of a barrier-free or liner-free conductive structure, in accordance with some embodiments.

In some embodiments, a partial deposition process may be used for ruthenium metal instead of the etch-back process described above with respect to FIGS. 15A-C and 16A-C. For example, instead of depositing ruthenium metal 110 to completely fill opening 600 as shown in FIG. 9, ruthenium metal 110 can be deposited to partially fill opening 600 as shown, for example, in FIGS. 17A and 18A. In some embodiments, deposition height $H_d$ of ruthenium metal 110 in opening 600, as shown in FIGS. 17A and 18A, can be adjusted so that it is above height H of the anchor point (e.g., greater than about 13 nm) and below the top surface of ILD 145. For example, opening 600 can be filled to a height $H_{d1}$ shown in FIG. 17A, which has an intermediate value between the deposition heights $H_d$ shown in FIG. 17A and FIG. 18A. As discussed above, partial deposition for ruthenium metal 110 may be preferred over a polishing process if the volume ratio 600/105 is greater than about 0.8. In the case of FIG. 17A, where ruthenium metal 110 is deposited thinner compared to FIG. 18A, cobalt integration into the resulting liner-free or barrier-free conductive structure is possible as shown from FIGS. 17B and 17C. Consequently, the amount of ruthenium deposited in opening 600 controls what portion of the deposited cobalt layer 1100 will remain in the final liner-free or barrier-free conductive structure shown in FIGS. 17C and 18C. For example, thinner ruthenium metal deposition results in additional cobalt incorporation into the final liner-free or barrier-free conductive structure as opposed to a thicker ruthenium metal deposition. Since a thinner ruthenium metal deposition results in additional cobalt incorporation, the liner-free or barrier-free conductive structure of FIG. 17C would be more resistive than the conductive structure of FIG. 18C. This is because ruthenium is less resistive than cobalt. Consequently, the resistance of the resulting structure increases as the amount of cobalt increases.

In some embodiments, ruthenium metal 110 is deposited thicker in opening 600 having larger critical dimensions and/or smaller aspect ratios compared to openings with smaller critical dimensions and/or larger aspect ratios. Therefore, it is possible that openings with different critical dimensions and/or aspect ratios can end up with a different amounts of cobalt as discussed above.

Figure 17B:
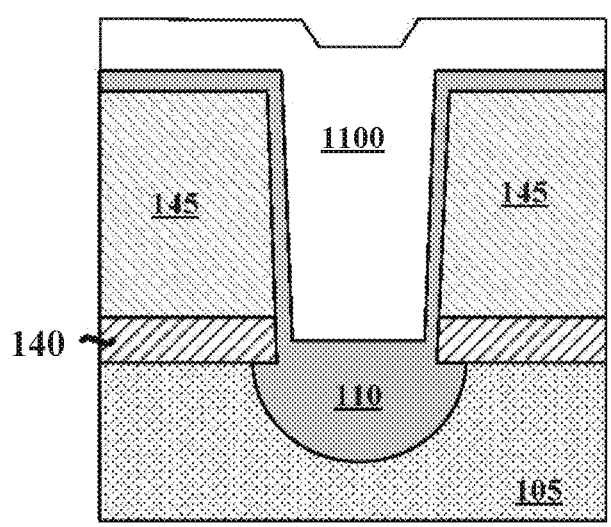
Figure 17C:
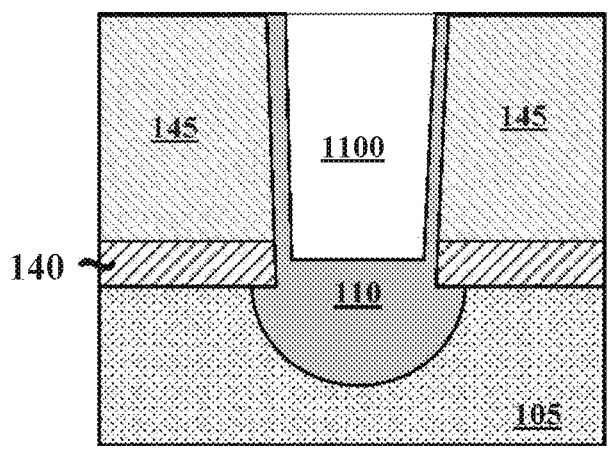
Figure 17C:
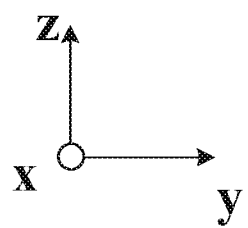
Figure 18A:
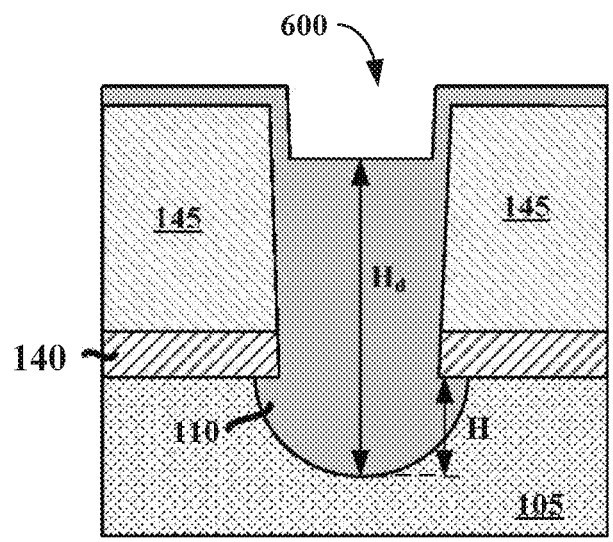
FIGS. 18A-C are magnified cross-sectional views of various fabrication operations during the formation of a barrier-free or liner-free conductive structure, in accordance with some embodiments.
Figure 18B:
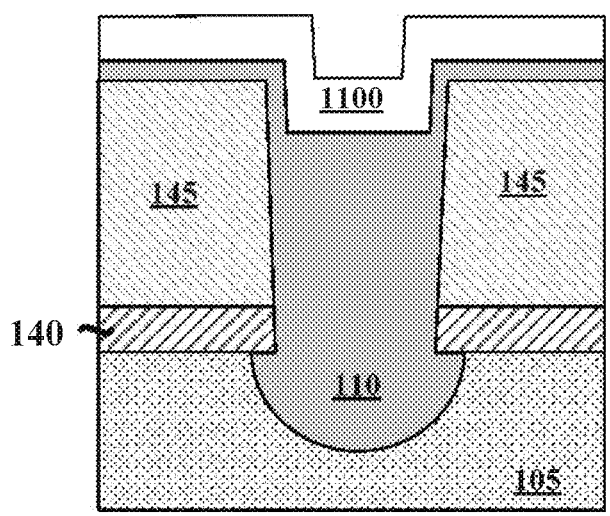
Figure 18C:
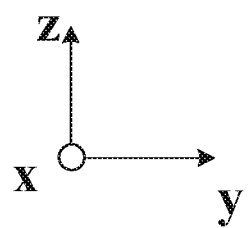
Figure 18C:
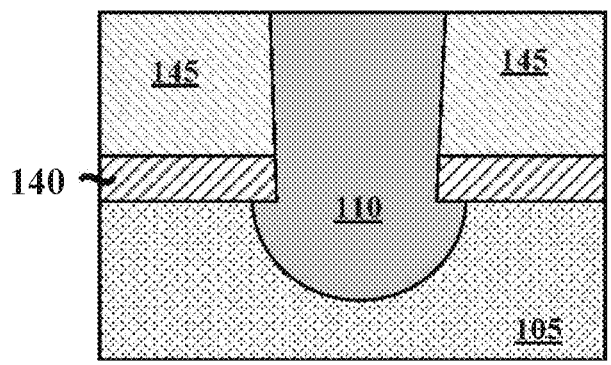

In some embodiments—contrary to the cobalt layer 1100 shown in FIGS. 11, 15B, and 16B—cobalt layer 1100 shown in FIGS. 17B and 18B is partially surrounded by ruthenium metal 110. Consequently, the surface area between cobalt layer 1100 and ruthenium metal 110 in FIGS. 17B and 18B is larger than that of FIGS. 11, 15B, and 16B. Cobalt out-diffusion from cobalt layer 1100 into ruthenium metal 110 during the heat treatment is enhanced for the structures of FIGS. 17B and 18B, which can result in further reduction of cobalt out-diffusion from cobalt conductive structure 105.

The embodiments provided with respect to FIGS. 15A-C, 16A-C, 17A-C, and 18A-C are not limiting. In addition, the embodiments provided in FIGS. 15A-C, 16A-C, 17A-C, and 18A-C can be combined or modified based on the description provided above to achieve a balance between cobalt out-diffusion mitigation from cobalt conductive structures 105 and overall contact resistance.

Various embodiments in accordance with this disclosure describe a method for the suppression of cobalt out-diffusion from underlying cobalt conductive structures to overlying ruthenium-filled liner-free or barrier-free conductive structures. In some embodiments, a cobalt layer formed on the ruthenium liner-free or barrier-free conductive structures acts as a "reservoir" of cobalt atoms that mitigates out-diffusion of cobalt atoms from underlying cobalt conductive structures. In some embodiments, the cobalt layer is a sacrificial layer subsequently removed prior to the formation of additional wiring levels. In some embodiments, the cobalt layer is integrated into the liner-free or barrier-free conductive structure. In some embodiments, the ruthenium liner-free or barrier-free conductive structures are recessed prior to the deposition of the cobalt layer. In some embodiments, the ruthenium metal is partially deposited prior to the deposition of the cobalt layer.

In some embodiments, a method includes forming a liner-free conductive structure on a cobalt conductive structure disposed on a substrate, depositing a cobalt layer on the liner-free conductive structure and exposing the liner-free conductive structure to a heat treatment. The method further includes removing the cobalt layer from the liner-free conductive structure.

In some embodiments, a structure includes a contact with a first metal disposed on a substrate, a dielectric layer disposed on the contact, and a liner-free conductive structure embedded in the dielectric layer and formed within the contact. The liner-free conductive structure includes a first portion comprising a second metal different from the first metal and a second portion comprising the first metal. The structure further includes a metal oxide disposed on the dielectric layer.

In some embodiments, a method includes forming a conductive structure with a first metal on a substrate. The method further includes forming, on the conductive structure, a liner-free conductive structure with a second metal different from the first metal; where forming the liner-free conductive structure includes: depositing an etch stop layer on the conductive structure, depositing a dielectric layer on the etch stop layer, forming an opening in the dielectric layer and the etch stop layer to expose the first metal, and depositing the second metal to partially fill the opening so that the second metal is in physical contact with the first metal, the etch stop layer, and the dielectric layer. Further, forming the liner-free conductive structure includes depositing the first metal to fill the opening and annealing the liner-free conductive structure.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
   forming a cobalt conductive structure on a substrate;
   forming a liner-free conductive structure comprising ruthenium, wherein the liner-free conductive structure extends into the cobalt conductive structure;
   depositing a cobalt layer on the liner-free conductive structure;
   exposing the liner-free conductive structure to a heat treatment; and
   removing the cobalt layer from the liner-free conductive structure.

2. The method of claim 1, further comprising forming one or more metallization layers on the liner-free conductive structure.

3. The method of claim 1, wherein forming the liner-free conductive structure comprises:
   depositing a dielectric layer on the cobalt conductive structure;
   forming an opening in the dielectric layer to expose a top portion of the cobalt conductive structure; and
   depositing a ruthenium metal to partially fill the opening.

4. The method of claim 3, wherein forming the opening comprises forming the opening with a ratio of a volume of the opening to a volume of the cobalt conductive structure being greater than about 0.2.

5. The method of claim 1, wherein prior to depositing the cobalt layer, etching the liner-free conductive structure.

6. The method of claim 1, wherein depositing the cobalt layer comprises depositing a thickness of cobalt between about 5 nm and about 20 nm.

7. A method, comprising:
   forming a conductive structure on a substrate, the conductive structure comprising cobalt; and
   forming a liner-free conductive structure on the conductive structure, the liner-free conductive structure comprising ruthenium;
   wherein forming the liner-free conductive structure comprises:
      depositing an etch stop layer on the conductive structure;
      depositing a dielectric layer on the etch stop layer;
      forming an opening in the dielectric layer and the etch stop layer that exposes the cobalt;
      depositing the ruthenium to partially fill the opening so that the ruthenium extends into the cobalt, the etch stop layer, and the dielectric layer; and
      depositing the cobalt on the ruthenium to fill the opening; and
   annealing the liner-free conductive structure.

8. The method of claim 7, wherein forming the liner-free conductive structure further comprises planarizing the liner-free conductive structure to remove the cobalt from the liner-free conductive structure.

9. The method of claim 7, wherein depositing the ruthenium comprises depositing ruthenium using a thermal chemical vapor deposition (CVD) process.

10. The method of claim 7, wherein depositing the cobalt comprises depositing the cobalt using a plasma-enhanced thermal CVD process.

11. The method of claim 7, wherein depositing the cobalt to fill the opening comprises depositing the cobalt into the opening such that the ruthenium surrounds the cobalt.

12. The method of claim 7, wherein forming the liner-free conductive structure further comprises planarizing the liner-free conductive structure to remove a top portion of the cobalt from the liner-free conductive structure.

13. The method of claim 7, further comprising forming one or more interconnect layers on the liner-free conductive structure.

14. The method of claim 7, further comprising recessing the ruthenium using an etch-back process, prior to depositing the cobalt.

15. A method, comprising:
   forming, over an integrated circuit transistor, a contact layer that comprises cobalt;
   forming an inter-layer dielectric (ILD) over the contact layer;
   forming, in the ILD, a via comprising ruthenium, wherein the via extends into the contact layer;
   depositing, on the via, a sacrificial layer comprising the cobalt;
   performing a thermal treatment to diffuse the cobalt from the sacrificial layer into voids in the ruthenium; and
   removing the sacrificial layer.

16. The method of claim 15, wherein performing the thermal treatment comprises heating the sacrificial layer to a temperature greater than 250° C.

17. The method of claim 15, wherein performing the thermal treatment reduces the diffusion of the cobalt from the contact layer into the via.

18. The method of claim 15, wherein forming the via comprises forming an anchor that extends into the contact layer.

19. The method of claim 15, wherein forming the via comprises partially filling the via with ruthenium.

20. The method of claim 19, further comprising depositing additional ruthenium in the via following removal of the sacrificial layer.

* * * * *